US007483277B2

(12) United States Patent
Sakai

(10) Patent No.: US 7,483,277 B2
(45) Date of Patent: Jan. 27, 2009

(54) METHOD AND APPARATUS FOR INSPECTING COMPONENT MOUNTING ACCURACY

(75) Inventor: Kazunobu Sakai, Yamanashi (JP)

(73) Assignee: Panasonic Corporation, Osaka (JP)

( * ) Notice: Subject to any disclaimer, the term of this patent is extended or adjusted under 35 U.S.C. 154(b) by 238 days.

(21) Appl. No.: 10/563,369

(22) PCT Filed: Mar. 8, 2005

(86) PCT No.: PCT/JP2005/003969

§ 371 (c)(1),
(2), (4) Date: Jan. 4, 2006

(87) PCT Pub. No.: WO2005/089036

PCT Pub. Date: Sep. 22, 2005

(65) Prior Publication Data
US 2006/0158831 A1 Jul. 20, 2006

(30) Foreign Application Priority Data
Mar. 15, 2004 (JP) ............... 2004-072174

(51) Int. Cl.
H05K 1/18 (2006.01)
(52) U.S. Cl. ...................... 361/761; 174/250
(58) Field of Classification Search ............ 361/761; 29/832; 174/250
See application file for complete search history.

(56) References Cited
U.S. PATENT DOCUMENTS
6,691,401 B2 * 2/2004 Hata et al. .................... 29/743

6,718,626 B2 * 4/2004 Kawada ....................... 29/740
6,739,036 B2 * 5/2004 Koike et al. .................. 29/743
7,089,656 B2 * 8/2006 Nagao et al. ................. 29/740
2004/0037055 A1 * 2/2004 Kawada ....................... 361/759

FOREIGN PATENT DOCUMENTS

| JP | 4-344411 | 9/1992 |
| JP | 4-344411 | 12/1992 |
| JP | 6-318800 | 11/1994 |
| JP | 3015144 | 12/1999 |
| JP | 3015144 | 3/2000 |
| JP | 2000-341000 | * 12/2000 |
| JP | 2004-22866 | 1/2004 |
| WO | 97/38567 | 10/1997 |
| WO | 2004/021760 | 3/2004 |

OTHER PUBLICATIONS

European Search Report issued Jul. 3, 2008 in European Application No. 05 72 0241.

* cited by examiner

Primary Examiner—Dean A. Reichard
Assistant Examiner—Yuriy Semenenko
(74) Attorney, Agent, or Firm—Wenderoth, Lind & Ponack, L.L.P.

(57) ABSTRACT

A component is mounted in a component mounting position on a component mounting-side surface of an inspection-use board which is formed from a light transmitting material and which has a reflecting surface disposed on a surface opposed to the component mounting side-surface and facing the component mounting side-surface. Light is applied to the component mounting-side surface of the inspection-use board. The applied light is transmitted through the component mounting-side surface and reflected on the reflecting surface so that an image of an outline of the component formed by reflected light coming from around the component through the component mounting-side surface is picked up. A component mounting accuracy is calculated based on the image.

8 Claims, 15 Drawing Sheets

METHOD AND APPARATUS FOR INSPECTING COMPONENT MOUNTING ACCURACY

TECHNICAL FIELD

The present invention relates to a method and an apparatus for inspecting a component mounting accuracy in component mounting operation for mounting components held by a component holding member on boards.

BACKGROUND ART

As this kind of method and apparatus for detecting component mounting accuracy, various methods and apparatuses have been known conventionally. For example, there is a method (see, e.g., Patent Document 1), in which an inspection-use jig component manufactured to have a dimensional tolerance higher than that of electric components handled by an electric component mounting apparatus is mounted on a board by a component suction nozzle in the electric component mounting apparatus. A displacement amount of a mounting position of the jig component on the board is detected, by which component mounting accuracy in the electric component mounting apparatus is detected.

In such a detection method, for example, the jig component, formed to have high dimensional tolerance and having its surface painted black, is mounted on a white or yellow synthetic resin board in a component mounting position. Then the upper side of the jig component is exposed to light so that an image of the outline of the jig component, formed by reflection of the light reflected by the surface of the board, is picked up and recognition processing of the image data is performed, by which a displacement amount of the mounting position is detected.

More specifically, when light is applied from the upper side of the jig component in the state of being mounted on the board, the applied light is not reflected by the surface (top surface) of the jig component (or the reflection amount is considerably reduced) since the jig component is painted in intense black. The applied light is reflected by the surface of the board (or the reflection amount is made larger than that on the surface of the jig component) since the surface of the board is made white or yellow. Therefore, the image of the outline of the jig component is formed by the reflection of light reflected only by the surface of the board (or a difference in amount between the reflected light from the surface of the board and the reflected light from the surface of the jig component).

By picking up an image of the outline and performing recognition processing of the image data, the mounting position of the jig component may be recognized with use of the outline thereof, and further by comparing the recognized mounting position with a preset reference mounting position data, the displacement amount can be detected. In addition, since the jig component is formed to have a dimensional tolerance higher than that of the electric components, it is possible to assume that the displacement amount is generated due to mounting position accuracy of the electric component mounting apparatus, and so the mounting position accuracy in the electric component mounting apparatus can be detected.

Patent Document 1: Japanese Patent Publication No. 3015144

DISCLOSURE OF INVENTION

With the increased progress of miniaturization and microminiaturization of electric components in recent years, electric components to be mounted are sometimes smaller than an end portion of a suction nozzle which is miniaturized while required minimum rigidity for component mounting is maintained. Examples of such miniaturized electric components include so-called 0603-chips (0.6 mm×0.3 mm rectangular components).

An electric component mounting apparatus handling such miniaturized electric components uses a jig component identical in size to the miniaturized electric components, and when the jig component is sucked and held by a suction nozzle and light is applied from the lower side of the suction nozzle for correction of the sucking and holding posture, an image of the outline of the jig component formed by the applied light cannot be acquired on the upper side of the suction nozzle since the jig component is smaller than the end portion of the suction nozzle. Further, since the surface of the jig component is painted in intense black for suppression of light reflection, it is not possible to reflect the applied light on the surface of the jig component and acquire an image of the jig component formed by the reflected light. Therefore, displacement of the holding posture generated when the jig component is sucked and held by the suction nozzle cannot be corrected by acquiring the image of the holding posture, and consequently a displacement amount, which is supposed to be eliminated by correction operation, is entirety added to a displacement amount of the mounting position of the jig component, thereby causing a problem in that the component mounting position accuracy in the electric component mounting apparatus for mounting the miniaturized electric components cannot be detected with accuracy.

There is also a case in which, instead of using such jig components, actual electric components are used to recognize a posture of the electric component sucked and held by the suction nozzle for detection of the component mounting accuracy. In such a case, a mounting head is equipped with a so-called reflector which reflects light for recognizing the posture of an electric component sucked and held by the suction nozzle. The reflector has a reflecting surface for reflecting the light, which is applied toward the upper side along the suction nozzle, toward the lower side, and by forming the reflecting surface with a red color for example, the reflector has a function to reflect red-colored light on the reflecting surface when the red-colored light is applied, and to absorb (i.e., substantively not to reflect) light of green color, which is a complementary color of the red color, on the reflecting surface when the green-colored light is applied. With such a function, acquisition of an image of the outline of the electric component sucked and held by the suction nozzle by a component camera disposed below the suction nozzle by utilizing the fact that the red-colored light is reflected by the reflector, and acquisition of an image formed by the light reflected by the surface of the sucked and held electric component by utilizing the fact that the green-colored light is absorbed by the reflector can be executed selectively.

However, even such techniques using the reflector are subject to constraints in selection of image pickup techniques due to the size relationship between the end portion of the suction nozzle and the electric component. More particularly, when the electric components are smaller than the end portion of the suction nozzle, there is a problem in that an image of the outline of the electric component using the red-colored light cannot be acquired.

Further, in a structure having such a reflector, while a special light source capable of applying the red-colored and green-colored light needs to be set on an electric component mounting apparatus, the light source set on each electric component mounting apparatus varies in type. This causes a problem in that, from the viewpoint of the equipment structure, image acquisition techniques requiring such special light sources are sometimes difficult to support.

Moreover, in the case of using the jig component, light is applied from the upper side to the surface of the board with the jig component mounted thereon, and since the electric components are miniaturized, light is applied to the electric components not only from the vertical upper side but also from inclined directions. In such a case, shadows of the jig component may be formed on the surface of the board, and in such a case, in an image of the outline of the jig component to be acquired, the outline of the jig component may be blurred, which causes a problem in that detection of an accurate component mounting position may possibly fail. Particularly, in detecting operation of the component mounting accuracy in the electric component mounting apparatus for mounting such miniaturized chip components, recognition of the outline of the jig component acquires importance, and therefore blurring of the outline becomes serious problem.

An object of the present invention is to provide a method and an apparatus for inspecting a component mounting accuracy capable of detecting high-precision component mounting accuracy in inspection operation of component mounting accuracy performed in component mounting operation for mounting components held by a component holding member on boards for solving the above-stated problems.

In order to accomplish the object, the present invention is structured as shown below.

According to a first aspect of the present invention, there is provided a method for inspecting a component mounting accuracy in a component mounting operation for mounting a component held by a component holding member on a board, comprising:

with use of an inspection-use component having an almost rectangular parallelepiped shape and having an irreflective surface as one surface and a reflecting surface as a surface opposed to the one surface, while applying light to the reflecting surface of the inspection-use component in a state that the irreflective surface is held by the component holding member, picking up a real image of the inspection-use component formed by reflected light created by the applied light;

recognizing a posture of the inspection-use component held by the component holding member by recognizing image data of the picked up real image;

mounting the inspection-use component with the component holding member in such a way that the reflecting surface of the inspection-use component is disposed in a component mounting position on a component mounting side-surface of an inspection-use board which is formed from a light transmitting material and which has a reflecting surface disposed on a surface opposed to the component mounting side-surface in a state of facing the component mounting side-surface, while correcting posture-displacement between the recognized holding posture and a reference holding posture;

while applying light to the component mounting-side surface of the inspection-use board so as to transmit the applied light through the component mounting-side surface and reflect the applied light on the reflecting surface, picking up an image of an outline of the inspection-use component formed by reflected light coming from around the inspection-use component through the component mounting-side surface; and calculating an actual mounting position of the inspection-use component by recognizing image data of the picked up outline, and then obtaining component mounting accuracy by calculating a difference between the actual mounting position and the preset component mounting position.

According to a second aspect of the present invention, there is provided the method for inspecting the component mounting accuracy as defined in the first aspect, wherein the light transmitting material is a glass material.

According to a third aspect of the present invention, there is provided the method for inspecting the component mounting accuracy as defined in the first aspect, wherein the reflecting surface of the inspection-use board is a specular reflecting surface for specular reflection of the applied light. The inspection-use board has a diffusion layer, disposed in between the component mounting-side surface and the specular reflecting surface, for diffusing the specular-reflected light.

According to a fourth aspect of the present invention, there is provided the method for inspecting the component mounting accuracy as defined in the first aspect, wherein the reflecting surface of the inspection-use board is a diffuse reflecting surface for reflecting the applied light with diffusion.

According to a fifth aspect of the present invention, there is provided the method for inspecting the component mounting accuracy as defined in the fourth aspect, wherein the diffuse reflecting surface is formed by applying a diffuse reflection sheet onto an opposite surface of the inspection-use board.

According to a sixth aspect of the present invention, there is provided a method for inspecting a component mounting accuracy in a component mounting operation for mounting a component held by a component holding member on a board, comprising:

mounting the component with the component holding member in a component mounting position on a component mounting side-surface of an inspection-use board, which is formed from a light transmitting material and which has a reflecting surface disposed on a surface opposed to the component mounting side-surface in a state of facing the component mounting side-surface;

while applying light to the component mounting-side surface of the inspection-use board so as to transmit the applied light through the component mounting-side surface and reflect the applied light on the reflecting surface, picking up an image of an outline of the component formed by reflected light coming from around the component through the component mounting-side surface; and calculating an actual mounting position of the component by recognizing image data of the outline acquired by the image pickup operation, and then obtaining component mounting accuracy by calculating a difference between the actual mounting position and the preset component mounting position.

According to a seventh aspect of the present invention, there is provided an apparatus for inspecting a component mounting accuracy in a component mounting apparatus for mounting a component held by a component holding member on a board, comprising:

an inspection-use board which is held by the component mounting apparatus in place of the board and formed from a light transmitting material, and which has a reflecting surface disposed on a surface opposed to its component mounting-side surface in a state of facing the component mounting-side surface;

an inspection-use component which is fed to the component mounting apparatus in place of the component and forms an almost rectangular parallelepiped shape having an irreflective surface as one surface and a reflecting surface as a surface opposed to the one surface, and which is held by the component holding member with its held surface as the irreflective surface and is mounted on the inspection-use board in such a way that the reflecting surface faces the component mounting-side surface of the inspection-use board;

a component image pickup device for applying light to the reflecting surface of the inspection-use component in a state that the irreflective surface is held by the component holding member and picking up an image of the inspection-use component formed by reflected light created by the applied light;

a board image pickup device for applying light to a component mounting-side surface of the inspection-use board with the inspection-use component mounted in a component mounting position so as to transmit the applied light through the component mounting-side surface and reflect the light on the reflecting surface, and picking up an image of an outline of the inspection-use component formed by reflected light coming from around the inspection-use component through the component mounting-side surface;

a holding posture recognition section for recognizing a posture of the inspection-use component held by the component holding member by recognizing image data of a real image of the inspection-use component in a state of being held so as to correct posture-displacement between the recognized holding posture and a reference holding posture;

a mounting position recognition section for recognizing an actual mounting position of the inspection-use component through recognizing image data of the outline of the inspection-use component in a state of being mounted; and a mounting accuracy operation section for obtaining the component mounting accuracy through calculating a difference between the actual mounting position recognized by the mounting position recognition section and the preset mounting position of the inspection-use component.

According to an eighth aspect of the present invention, there is provided the apparatus for inspecting the component mounting accuracy as defined in the seventh aspect, wherein the light transmitting material is a glass material.

According to a ninth aspect of the present invention, there is provided the apparatus for inspecting the component mounting accuracy as defined in the seventh aspect or eighth aspect, wherein the reflecting surface of the inspection-use board is a specular reflecting surface for specular reflection of the applied light. The inspection-use board has a diffusion layer for diffusing the specular-reflected light.

According to a tenth aspect of the present invention, there is provided the apparatus for inspecting the component mounting accuracy as defined in the seventh aspect or eighth aspect, wherein the reflecting surface of the inspection-use board is a diffuse reflecting surface for reflecting the applied light with diffusion.

According to an eleventh aspect of the present invention, there is provided an apparatus for inspecting a component mounting accuracy in a component mounting apparatus for mounting a component held by a component holding member on a board, comprising:

an inspection-use board which is held by the component mounting apparatus in place of the board and formed from a light transmitting material, and which has a reflecting surface disposed on a surface opposed to its component mounting-side surface in a state of facing the component mounting-side surface;

a board image pickup device for applying light to a component mounting-side surface of the inspection-use board with the inspection-use component mounted in a component mounting position so as to transmit the applied light through the component mounting-side surface and reflect the light on the reflecting surface, and picking up an image of an outline of the inspection-use component formed by reflected light coming from around the component through the component mounting-side surface;

a mounting position recognition section for recognizing an actual mounting position of the component through recognizing image data of the outline of the component in a state of being mounted; and a mounting accuracy operation section for obtaining the component mounting accuracy by calculating a difference between the actual mounting position recognized by the mounting position recognition section and the preset mounting position of the component.

According to the first aspect of the present invention, when the holding posture of the inspection-use component held by the component holding member is recognized in the method for inspecting a component mounting accuracy, an image of the outline of the inspection-use component acquired by light application is not picked up, but an actual image of the inspection-use component formed by reflected light created by the light application is picked up. This makes it possible to credibly acquire an image of the holding posture of the inspection-use component without being influenced by the shape or size of the end portion of the component holding member. Particularly, in the case where the inspection-use component is a miniaturized component with a size smaller than that of the end portion of the component holding member, the image pickup of the outline is difficult but acquisition of the real image formed by the reflected light is possible, and this makes the inspection method more effective.

Moreover, based on the thus-picked up image, the holding posture of the inspection-use component is recognized, and the inspection component is mounted on the board while posture displacement is corrected based on the recognition result, which makes it possible to reduce an influence of the posture displacement exerted on mounting position displacement of the inspection component. Therefore, light is then applied to the board, and an image of the outline of the inspection component formed by reflected light around the inspection component on the board acquired by the light application is picked up and subjected to recognition processing, so that a mounting position displacement amount can be calculated. The calculated mounting position displacement amount can be detected as component mounting accuracy. More particularly, the mounting position displacement amount does not include the posture displacement of the holding posture, and therefore the mounting position displacement amount can be used for high-precision calculation as it is.

Moreover, using the inspection component having an irreflective surface as one surface and a reflecting surface as a surface opposed thereto allows more effective reflection of the applied light on the reflecting surface so as to achieve clear image acquisition in the case where an image of the holding posture of the inspection component is picked up in the state that the irreflective surface is held by the component holding member. Further, by mounting the inspection-use component on the board in this holding state and putting the inspection-use component in a state that the reflecting surface of the inspection-use component is disposed in such a way as to face the component mounting-side surface of the board, light applied toward the component mounting-side surface can be absorbed instead of being reflected on the surface of the inspection-use component. This makes it possible to acquire a clearer image of the outline of the inspection-use component. Therefore, it becomes possible to implement the inspection for component mounting accuracy with higher precision.

Further, with use of the inspection-use board formed from a light transmitting material and having a reflecting surface disposed on the surface opposed to the component mounting-side surface in such a way as to face the component mounting-side surface, it becomes possible to pick up an image of the outline of the inspection-use component formed by light transmitted through the component mounting-side surface and reflected on the reflecting surface. In the case where an image of the outline formed by light reflected on the component mounting-side surface is picked up in a conventional way, shadows of the inspection-use component are sometimes formed on the component mounting-side surface by delicate inclination in application direction of the light and the like, which makes the outline of the inspection-use component in the image of the outline blurry. However, forming the reflecting surface on a surface different from the component mounting-side surface as in the present aspect enables the light reflected on the reflecting surface to travel almost evenly into the inside of the inspection-use board, i.e., to travel almost evenly into the component mounting-side surface. Therefore, the reflected light going into the component mounting-side surface can be distinctly blocked in a portion where the inspection-use component is mounted in conformity with the outline shape of the mounting surface, thereby making it possible to implement clear image acquisition without blurring the outline of the inspection-use component in the image of the outline.

According to the second aspect of the present invention, employing a glass material as the light transmitting material makes it possible to enhance structural strength of the inspection-use board to reduce a deflection amount thereof. Therefore, it becomes possible to reduce generation of displacement attributed to the deflection, making it possible to implement high-precision inspection.

According to the third aspect of the present invention, the inspection-use board has a specular reflecting surface as the reflecting surface and a diffusion layer disposed in between the component mounting-side surface and the specular reflecting surface, so that light applied to the specular reflecting surface through the component mounting-side surface can be reflected on the specular reflecting surface and the reflected light can be diffused when being passed through the diffusion layer. This allows an amount of light diffused inside the inspection-use board to be balanced. Moreover, since the thickness of the inspection-use board can be set in conformity with an optical path length necessary for diffusion within a thickness range of the inspection-use board, the reflected light can be diffused at a desired diffusion amount, thereby making it possible to form a more uniform surface light source inside the inspection-use board.

According to the fourth aspect of the present invention, the inspection-use board having a diffuse reflecting surface as the reflecting surface allows light applied to the diffuse reflecting surface through the component mounting-side surface to be reflected on the diffuse reflecting surface and allows the reflected light to be diffused, thereby ensuring diffusion of the reflected light inside the inspection-use board. Moreover, in the case where such a diffuse reflecting surface is used, it becomes possible to prevent active light diffusion in a portion other than the diffuse reflecting surface inside the inspection-use board, so that an amount of light reaching the diffuse reflecting surface (i.e., diffuse-reflected light) can be increased, and as a result a light amount of the diffuse-reflected light can be increased.

According to the fifth aspect of the present invention, the diffuse reflecting surface may be formed by application of the diffuse reflection sheet.

According to the sixth aspect of the present invention, when an actual component is mounted on the inspection-use board, a clear image can be acquired, which makes it possible to implement high-precision inspection.

According to the seventh aspect of the present invention, the apparatus for inspecting component mounting accuracy includes an inspection-use component, an inspection-use board, a component image pickup device, a board image pickup device, a holding posture recognition section, and a mounting accuracy operation section, and this makes it possible to provide an apparatus for inspecting component mounting accuracy capable of implementing an inspection method which can offer the same effects as those in the first aspect.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Embodiment

Figure 1:
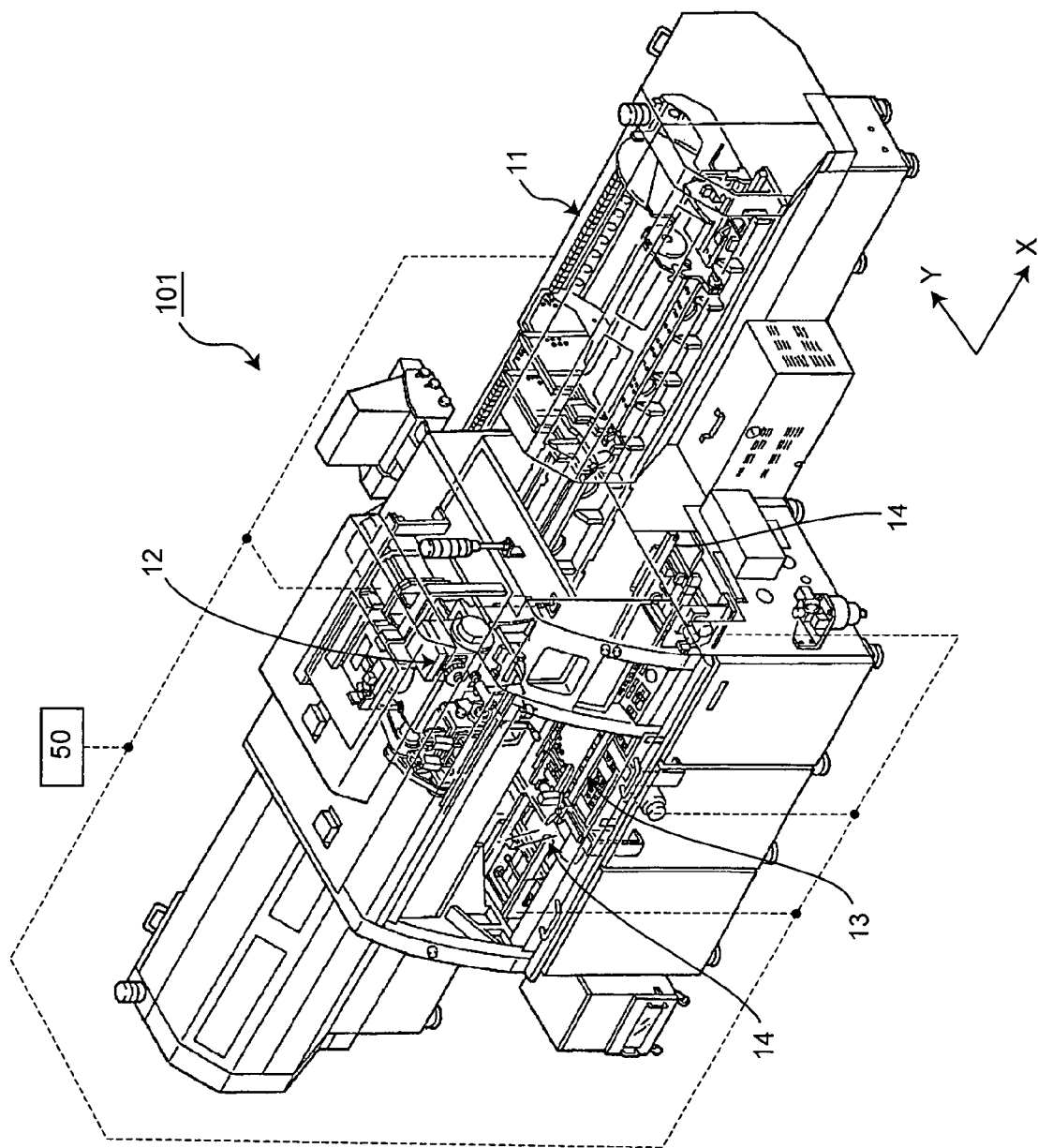
FIG. 1 is a semi-perspective view showing an electric component mounting apparatus in which inspection of component mounting accuracy is performed according to one embodiment of the present invention.

Before the description of the present invention proceeds, it is to be noted that like parts are designated by like reference numerals throughout the accompanying drawings.

Hereinbelow, the embodiments of the present invention will be described in detail with reference to the drawings.

FIG. 1 is a perspective view showing the outline of an electric component mounting apparatus 101 exemplifying a component mounting apparatus subjected to inspection of component mounting accuracy in a first embodiment of the present invention.

As shown in FIG. 1, the electric component mounting apparatus 101 is an apparatus which performs component mounting operation for mounting a plurality of electric components, which exemplifies fed components, in component mounting positions on a board. The electric component mounting apparatus 101 is including a component feed unit 11 for containing a plurality of electric components in an extractable way and feeding each of the contained electric components, a main shaft device 12 which includes a plurality of nozzle units having a plurality of suction nozzles exemplifying component holding members for performing suction holding/holding cancellation of electric components, an XY table 13 for holding a board on which each electric component is mounted and for moving the held board in an X-axis direction or a Y-axis direction which are directions almost along the surface of the board as viewed in the drawing with respect to the respective suction nozzles of the main shaft device 12, and a board transportation device 14 for transporting the board fed to the electric component mounting apparatus 101 and feeding it onto the XY table 13 and for transporting the board on which electric components were mounted on the XY table 13 and discharging it out of the electric component mounting apparatus 101.

Figure 2:
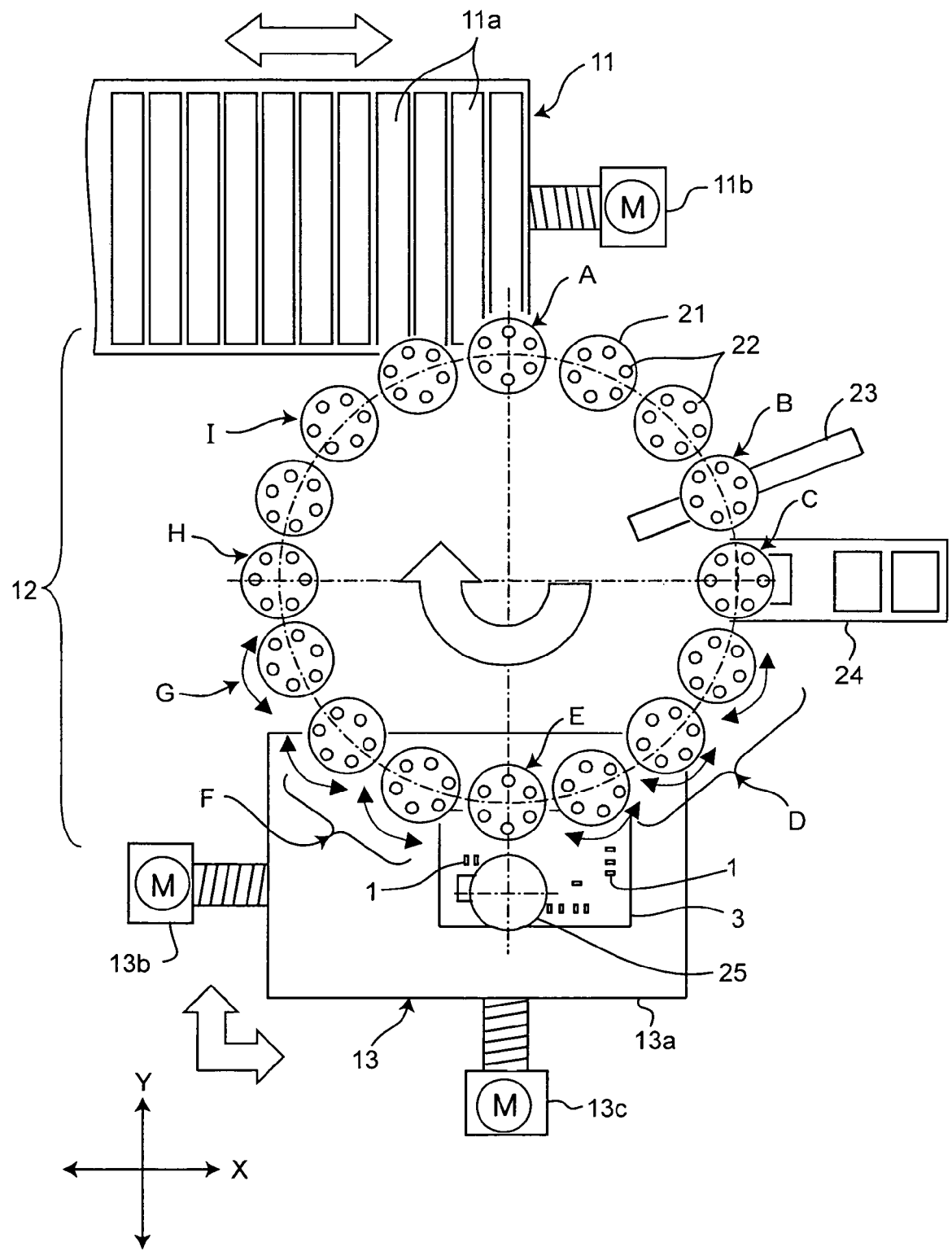
FIG. 2 is a schematic plan view showing a structure of the electric component mounting apparatus of FIG. 1.

FIG. 2 is a fragmentary enlarged schematic plan view for explaining the mounting operation of the electric components in the electric component mounting apparatus 101. As shown in FIG. 2, the main shaft device 12 has total 16 nozzle units 21 having the same shape and function, and the respective nozzle units 21 are disposed on the same circumference at equal intervals. Moreover, each nozzle unit 21 has six suction nozzles 22, and respective suction nozzles 22 are disposed around the center of the nozzle unit 21 at equal intervals.

Figure 3:
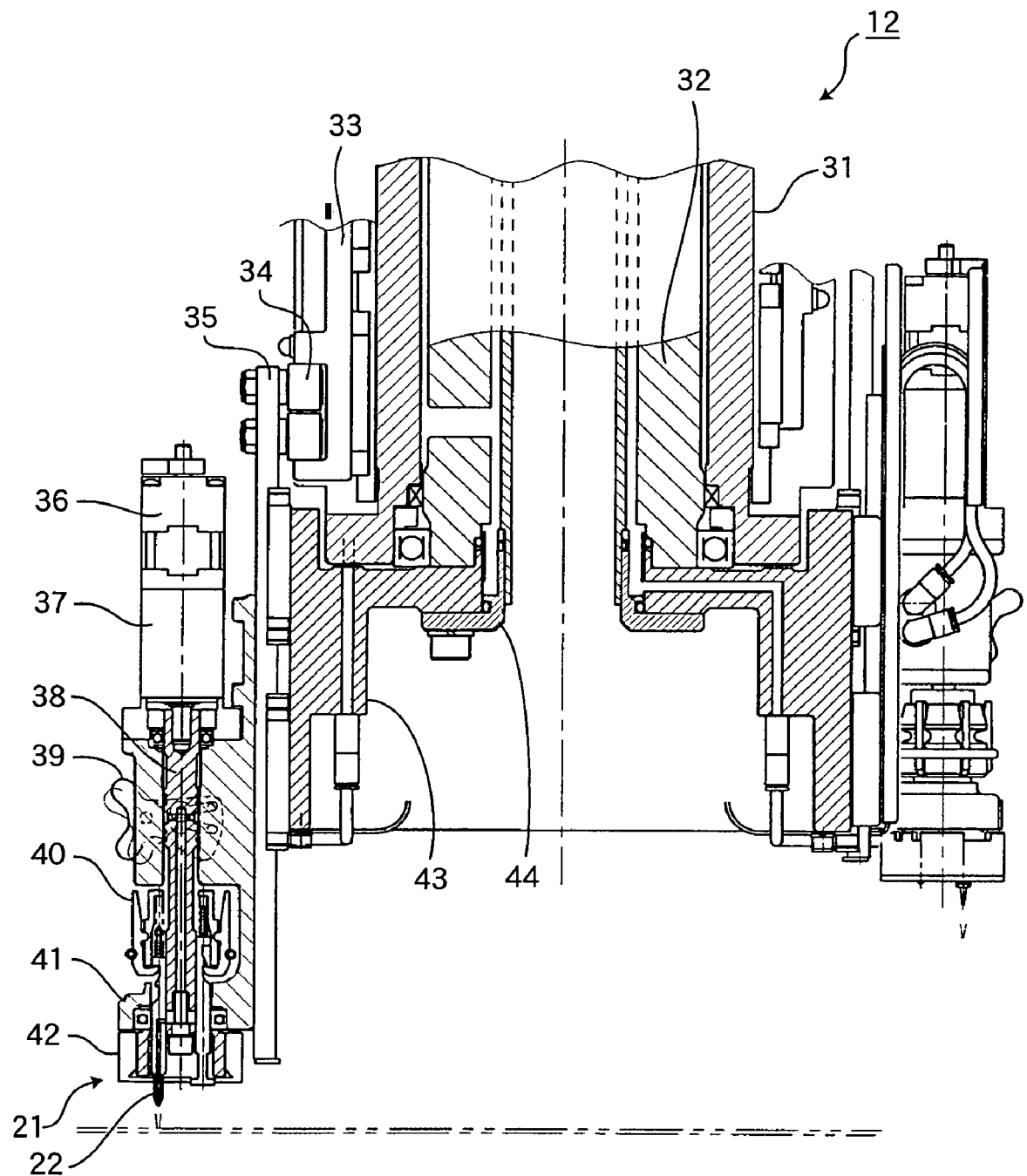
FIG. 3 is a cross sectional view showing a main shaft device in the electric component mounting apparatus.

Herein, a schematic cross sectional view of the main shaft device 12 is shown in FIG. 3, and the detailed structure of the main shaft device 12 is described with reference to FIG. 3. As shown in FIG. 3, the main shaft device 12 has a rotational drive device for revolving respective nozzle units 21 around a rotating shaft S disposed in the center of an arrangement circle of the respective nozzle units 21, and the rotational drive device has a rotating shaft 32 disposed so the center of the shaft is aligned with the rotating shaft S. A rotating table 43 is fixed through a flange 44 in the lower end of the rotating shaft 32 as viewed in the drawing. It is to be noted that though not shown in FIG. 3, the rotating shaft S is linked to the rotational drive section having a drive motor and the like in the upper side of the drawing, which allows the rotating shaft S to be rotationally driven.

As shown in FIG. 3, on the outer peripheral surface of the rotating table 43, the respective nozzle units 21 are supported via guides 35 (consisting of, for example, LM rails and LM blocks) in such a manner as to be able to move up and down. Further, on the outer periphery of the rotating shaft 32, a cylindrical cam section 31 for rotatably accommodating and supporting the rotating shaft 32 is disposed. The cylindrical cam section 31 is fixed onto a rigid frame and the like of the electric component mounting apparatus 101 so as not to be rotated around the rotating shaft S when the rotating shaft 32 is rotationally driven. Moreover, a follower sections 34 are fixed onto the top end of the guides 35 of the respective nozzle units 21, and further, a slider section 33 to be engaged with the respective a follower sections 34 is fixed onto the outer peripheral surface of the cylindrical cam section 31. Moreover, engagement portions between the slider section 33 and the respective a follower sections 34 form guide groove sections 33a formed along the revolving direction of the respective nozzle units 21, and the engaged respective a follower sections 34 can slide along the guide groove sections 33a. Further, the guide groove sections 33a are formed in such a way that their height positions vary along their formation directions. Consequently, when the respective nozzle units 21 are revolved, the respective a follower sections 34 slide along the guide groove sections 33a, and during this sliding movement, respective engagement positions vary in conformity with the formation height positions of the guide groove sections 33a, as a result of which the respective nozzle units 21 are moved up and down via the guides 35.

Moreover, as shown in FIG. 3, each of the nozzle units 21 has a θ rotating motor 36 for driving the revolution of the suction nozzles 22, a speed reducer 37 linked to the θ rotating motor 36, and a shaft 38 linked to the speed reducer 37 in such a way as to allow transmission of the rotational drive and supporting each of the suction nozzles 22 through a casing 41. Further, each of the nozzle units 21 has a valve 39 and hooks 40 as mechanisms to separately perform up-and-down movement of each of the suction nozzles 22, and further has a reflector 42.

Moreover, as shown in FIG. 2, in the main shaft device 12, the rotational drive section allows the respective nozzle units 21 to be rotationally driven in an intermittent manner at a specified rotation angle pitch through the rotating shaft 32 and the rotating table 43. For example, in the main shaft device 12, total 16 nozzle units 21 can be rotationally driven clockwise as viewed in the drawing in an intermittent manner at an angle pitch of 22.5 degrees as the specified rotation angle pitch. By the rotational drive, the respective nozzle units 21 are moved along their arrayed circumference at the rotation angle pitch and positioned at various positions on the arrayed circumference. Herein, assuming that an angle coordinate of an upper end position on the arrayed circumference as viewed in the drawing is 0 degrees and respective angle coordinates are formed clockwise as viewed in the drawing, the respective nozzle units 21 are rotationally driven so as to be sequentially positioned at the above-stated positions, that is, an electric component suction position A (angle coordinate of 0 degrees), a component thickness detection position B at which the thickness of a sucked and held electric component is detected (angle coordinate of 67.5 degrees), a component recognition position C at which an image of the sucked and held electric component is picked up and a suction-and-holding posture of the electric component is recognized based on the image (angle coordinate of 90 degrees), a rotation correction position D at which the suction-and-holding posture is corrected by rotation of the nozzle unit 21 based on the recognition result (angle coordinate of 112.5 to 157.5 degrees), a component mounting position E at which the electric component is mounted on the board (angle coordinate of 180 degrees), a suction nozzle selection position F at which a suction nozzle 22 included in the nozzle unit 21 is selected (angle coordinate of 202.5 to 225 degrees), a defective component discharge position G at which a defective component not mounted on the board is discharged (angle coordinate of 247.5 degrees), a suction nozzle return position H at which the nozzle unit 21 is moved up and the respective suction nozzles 22 are returned to the upper position (angle coordinate of 270 degrees), and further a suction nozzle pullout position I at which the nozzle unit 21 is moved down and the respective suction nozzles 22 in the returned state are positioned on the lower side (angle coordinate of 315 degrees). It is to be noted that after being positioned at the suction nozzle pullout position I, the respective nozzle units 21 are positioned again at the suction position A by the rotational drive.

Moreover, as shown in FIG. 2, a component feed unit 11 is disposed on the upper side of the main shaft device 12 as viewed in the drawing, and the component feed unit 11 has a plurality of parts feeders 11a disposed in array in the X axis direction as viewed in the drawing for storing a number of electric components in a component containing tape in an extractable way. Further, the component feed unit 11 has a feeder moving section 11b for moving the respective parts feeders 11a back and forth along the X axis direction as viewed in the drawing so as to position a desired parts feeder 11a in the suction position A in the main shaft device 12 and to allow the stored electric components to be extracted from the parts feeder 11a.

Moreover, as shown in FIG. 2, the XY table 13 is disposed under the mounting position E in the main shaft device 12, and the nozzle unit 21 positioned in this position can mount respective electric components 1 on a board 3 held by a board holding table 13a of the XY table 13. The XY table 13 has an X axis drive section 13b for moving the board holding table 13a back and forth in the X axis direction as viewed in the drawing and a Y axis drive section 13c for moving the board holding table 13a back and forth in the Y axis direction as viewed in the drawing.

Moreover, as shown in FIG. 2, a component thickness detection sensor 23 is provided in the component thickness detection position B in the main shaft device 12, and below the component recognition position C, a component recognition camera 24 is provided for picking up images of the suction-and-holding postures of the electric components 1 sucked and held by the respective suction nozzles 22 disposed above. Further, above the XY table 13, a board recognition camera 25 is provided for picking up images of the electric components 1 mounted on the board 3 from above. Based on the images picked up by the board recognition camera 25, a displacement amount of a mounting position of the electric component 1 on the board 3 is detected (recognized).

Figure 4:
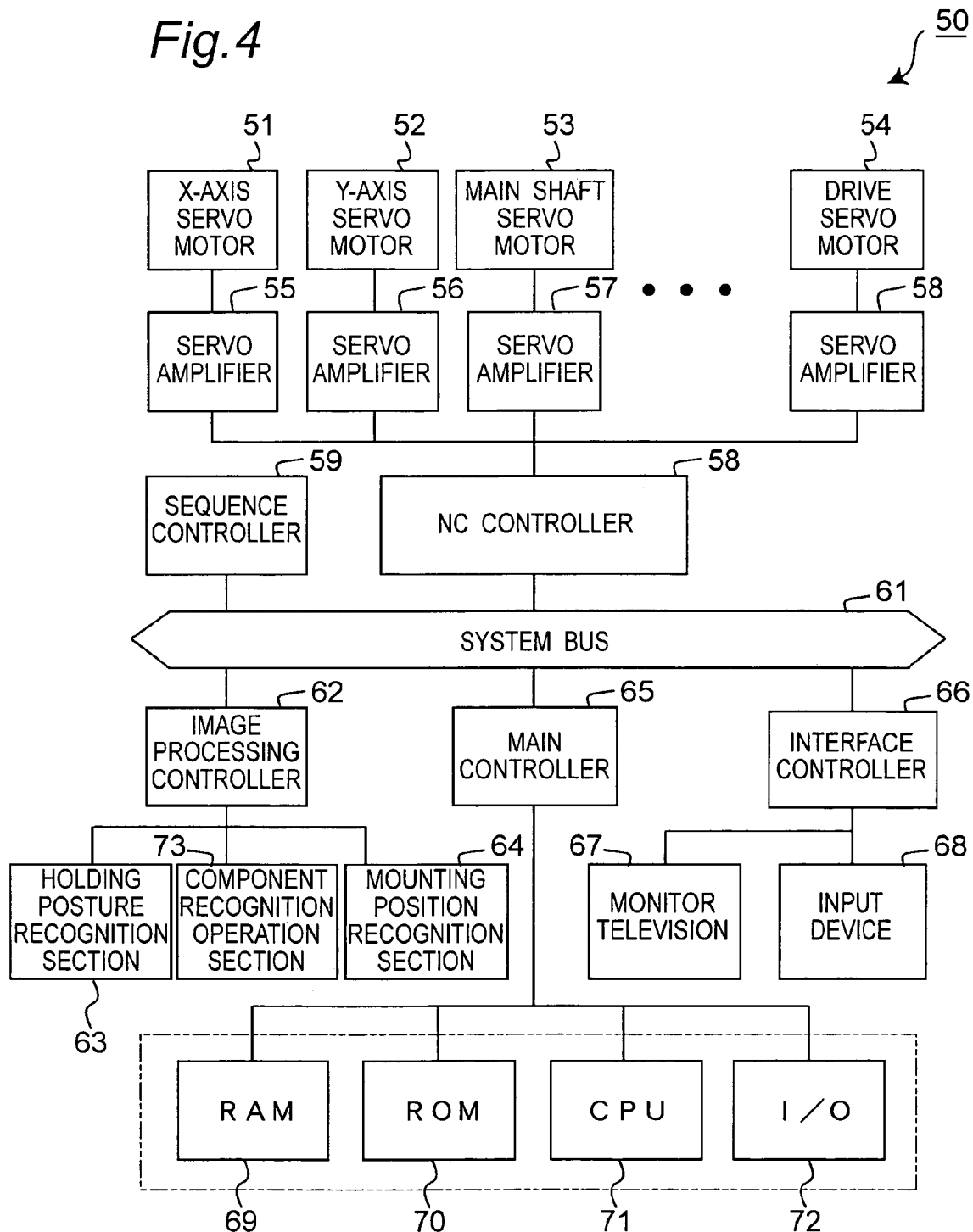
FIG. 4 is a control block diagram showing a structure of a control device in the electric component mounting apparatus.

Moreover, the electric component mounting apparatus 101 has a control device 50 which performs comprehensive control while associating operation control of respective component sections with each other. Herein, FIG. 4 shows a control block diagram showing a main configuration of the control device 50. As shown in FIG. 4, the control device 50 is controlled by a main controller 65. The main controller 65 has a RAM 69, a ROM 70, a CPU 71 and an I/O 72, and is connected through a system bus 61 to a sequence controller 59, an NC controller 60, an image processing controller 62 and an interface controller 66.

The interface controller 66 is a controller for performing control regarding information exchange between the control device 50 and the outside, and the interface controller 66 is connected to a monitor television 67 and an input device 68 for data exchange with operators. The NC controller 60 is a controller performing control regarding drive operation of respective drive sections in the electric component mounting apparatus 101, and the NC controller 60 is connected through respective servo amplifiers 55, 56, 57, 58 to motors of respective drive sections in the electric component mounting apparatus 101. For example, the NC controller 60 is connected through the servo amplifier 55 to an X axis servo motor 51 for driving the X axis drive section 13b, and through the servo amplifier 56 to a Y axis servo motor 52 for driving the Y axis drive section 13c. Further, the NC controller 60 is connected through the servo amplifier 57 to a main shaft servo motor 53 for driving the rotational drive section in the main shaft device 12, and through the servo amplifier 58 to a drive servo motor 43 for driving other drive sections.

The image processing controller 62 is a controller performing control regarding recognition processing of images picked up by the component recognition camera 24 and the board recognition camera 25, and the image processing controller 62 is connected to a holding posture recognition section 63 which performs recognition processing of the suction-and-holding postures of the electric components 1 by the suction nozzles 22 through recognition processing of the images picked up by the component recognition camera 24 and is connected to a mounting position recognition section 64 which performs recognition processing of the mounting positions of the electric components 1 on the board 3 through recognition processing of the images picked up by the board recognition camera 25.

In the holding posture recognition section 63, the suction-and-holding posture of the electric component 1 after application of the recognition processing may be collated with a preset reference holding posture so as to calculate a posture displacement amount between both the postures and output the posture displacement amount as a correction amount. With use of the thus-outputted correction amount, the suction nozzle 22 or the nozzle unit 21 are rotationally driven by the NC controller 60, which allows the posture displacement amount to be corrected.

Further, the image processing controller 62 has a mounting accuracy operation section 73 which collates an actual mounting position of the electric component 1 recognized by the mounting position recognition section 64 with a mounting position of the electric component 1 preset in design so as to calculate a displacement amount between both the positions and carry out an operation to calculate component mounting accuracy with the calculated displacement amount as the component mounting accuracy. It is to be noted that information on the mounting accuracy calculated by the mounting accuracy operation section 73 can be inputted into the interface controller 66 through the system bus 61 and outputted to the outside of the control device 50 through the monitor television 67.

Moreover, the electric component mounting apparatus 101 has a mounting accuracy inspection apparatus (or may have a mounting error detection apparatus). The mounting accuracy inspection apparatus has an inspection-use jig component 5 exemplifying the inspection-use component shown in FIG. 5A and FIG. 5B and an inspection-use jig board 7 exemplifying the inspection board shown in FIG. 7 prepared, and also includes component recognition camera 24 and board recognition camera 25 shown in FIG. 2, and an image processing controller 62, a holding posture recognition section 63, a mounting position recognition section 64 and a mounting accuracy operation section 73 in the control device 50 shown in FIG. 4. The configuration of a hardware portion of the mounting accuracy inspection apparatus is essentially constituted of electric component mounting apparatus, and by preparing an operation program, a jig component 5 and a jig board 7, the mounting accuracy inspection apparatus can be structured.

Figure 5A:
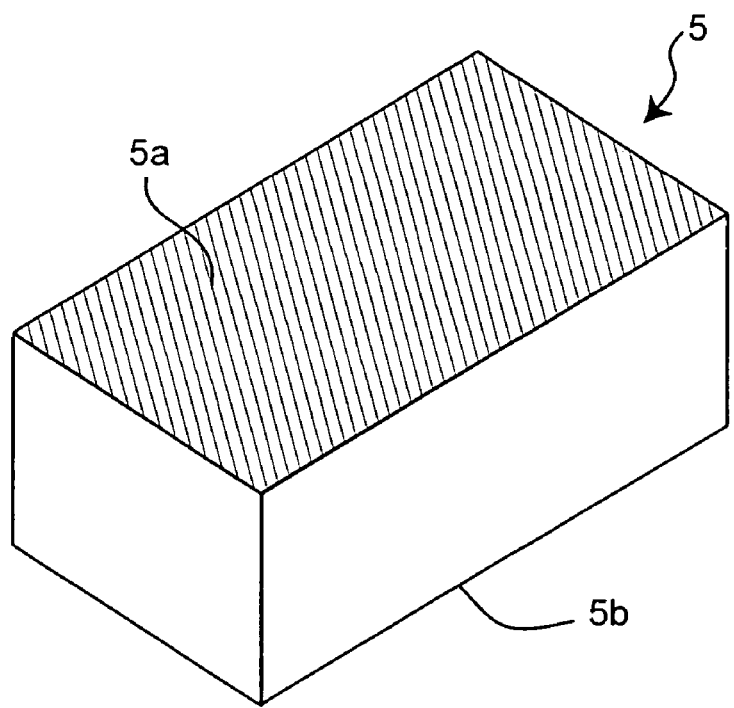
FIG. 5A is an outline perspective view showing an inspection-use jig component for use in the inspection of component mounting accuracy in the state that an irreflective surface is disposed as an upper surface.
Figure 5B:
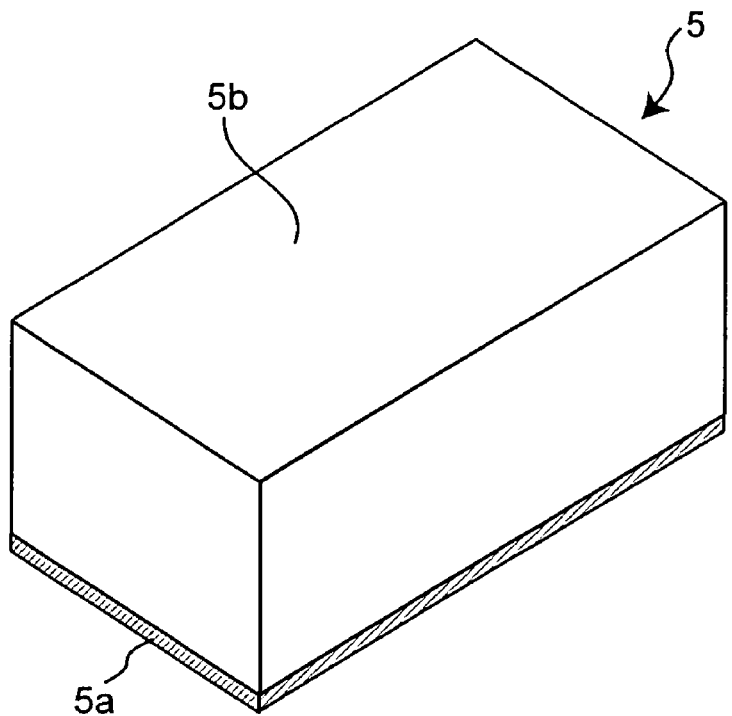
FIG. 5B is an outline perspective view showing the inspection-use jig component for use in the inspection of component mounting accuracy in the state that a reflecting surface is disposed as an upper surface.

Description is now given of the jig component 5 for use in the mounting accuracy inspection apparatus. As shown in FIG. 5A and FIG. 5B, the jig component 5 has a shape, e.g., an almost rectangular solid shape, that is identical to the electric component 1 handled by the electric component mounting apparatus 101, and is formed with dimensional tolerance higher than that of the electric component 1. It is to be noted that FIG. 5A is a schematic perspective view in the case where one surface of the jig component 5 is disposed as a top surface, while FIG. 5B is a schematic perspective view in the case where the surface opposed to the one surface of the jig component 5 is disposed as a top surface (i.e., the jig component 5 in FIG. 5A is disposed up side down).

Figure 6A:
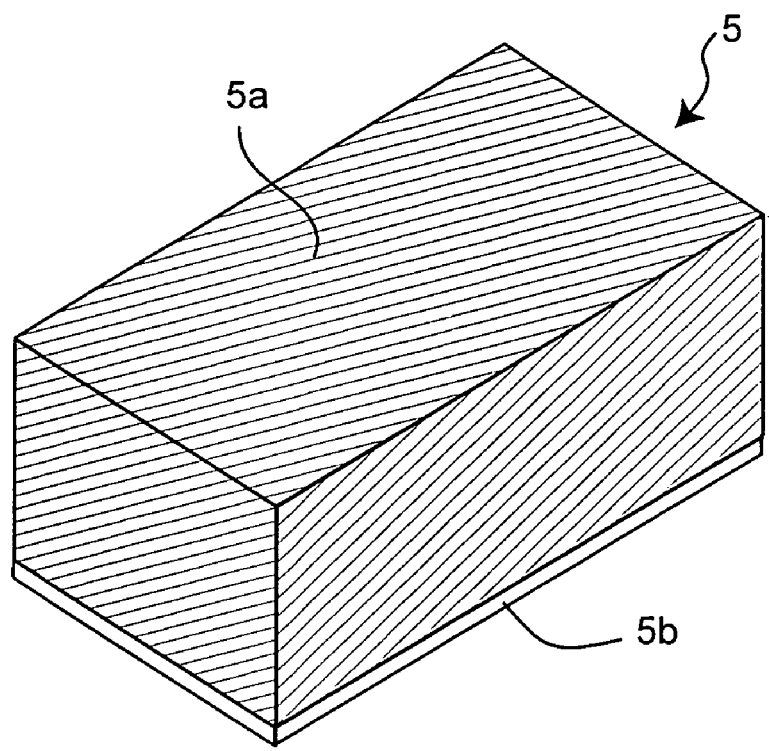
FIG. 6A is an outline perspective view showing an inspection-use jig component in another example for use in the inspection of component mounting accuracy in the state that the irreflective surface is disposed as an upper surface.
Figure 6B:
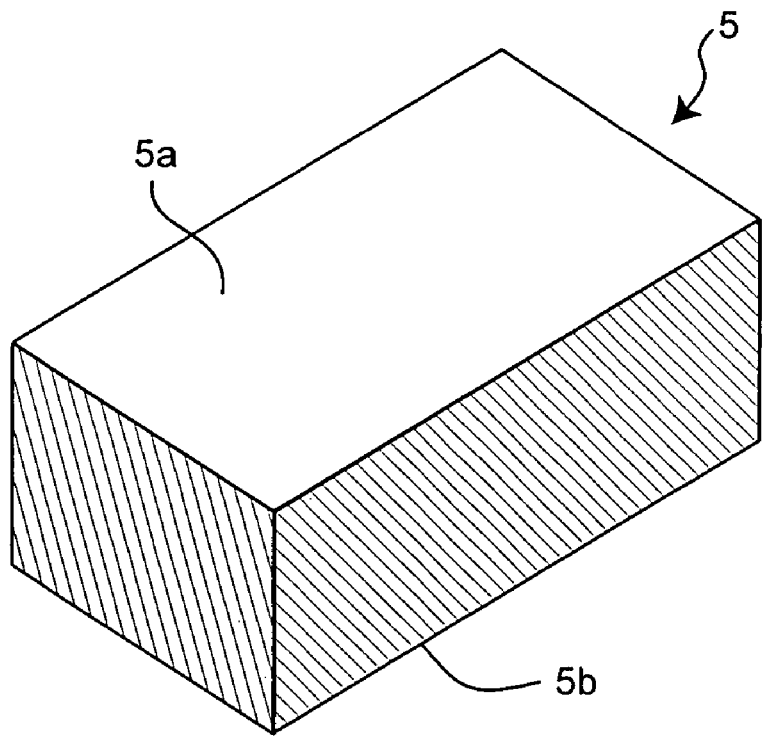
FIG. 6B is an outline perspective view showing the inspection-use jig component in another example for use in the inspection of component mounting accuracy in the state that the reflecting surface is disposed as an upper surface.

As shown in FIG. 5A, the one surface of the jig component 5 (i.e., the top surface in FIG. 5A) is an irreflective surface 5a that is a black-colored surface so as to make it difficult to reflect applied light. On the contrary, as shown in FIG. 5B, the surface opposed to the one surface of the jig component 5 (i.e., the top surface in FIG. 5B) is a reflecting surface 5b that is a white-colored surface so as to achieve effective reflection of applied light. Herein in the present specification, the "reflecting surface" refers to the surface which reflects light when the light is applied to the surface, and whose picked up image in an image recognition operation (or image pickup operation) is relatively bright. The "irreflective surface" refers to the surface which absorbs light when the light is applied to the surface and whose picked up image in image recognition operation is relatively dark. It is to be noted that as shown in FIG. 5A and FIG. 5B, respective lateral surfaces other than the irreflective surface 5a and the reflecting surface 5b in the jig component 5 are white-colored surfaces. Such a jig component 5 may be formed by, for example, forming the jig component 5 itself from a white-colored material such as white-colored alumina and white-colored resin, then forming the irreflective surface 5a by applying black-colored resin, black-colored glass materials and the like to the one surface, and forming the reflecting surface 5b by using its material color or applying alumina, plating, white-colored resin, white-colored glass materials or the like to the surface opposed to the one surface. Further, the jig component 5 itself may be formed from materials basically in black color as shown in FIG. 6A and FIG. 6B instead of being formed from materials basically in white color. In such a case, for example, the jig component 5 itself may be formed by using black-colored materials including black-colored ceramic materials such as black-colored zirconia and black-colored resin materials, and then the irreflective surface 5a may be formed by using its material color or by applying black-colored resin, black-colored glass materials or the like to the one surface, and the reflecting surface 5b may be formed by applying plating or white-colored resin, white-colored glass materials or the like to the surface opposite to the one surface.

Figure 7:
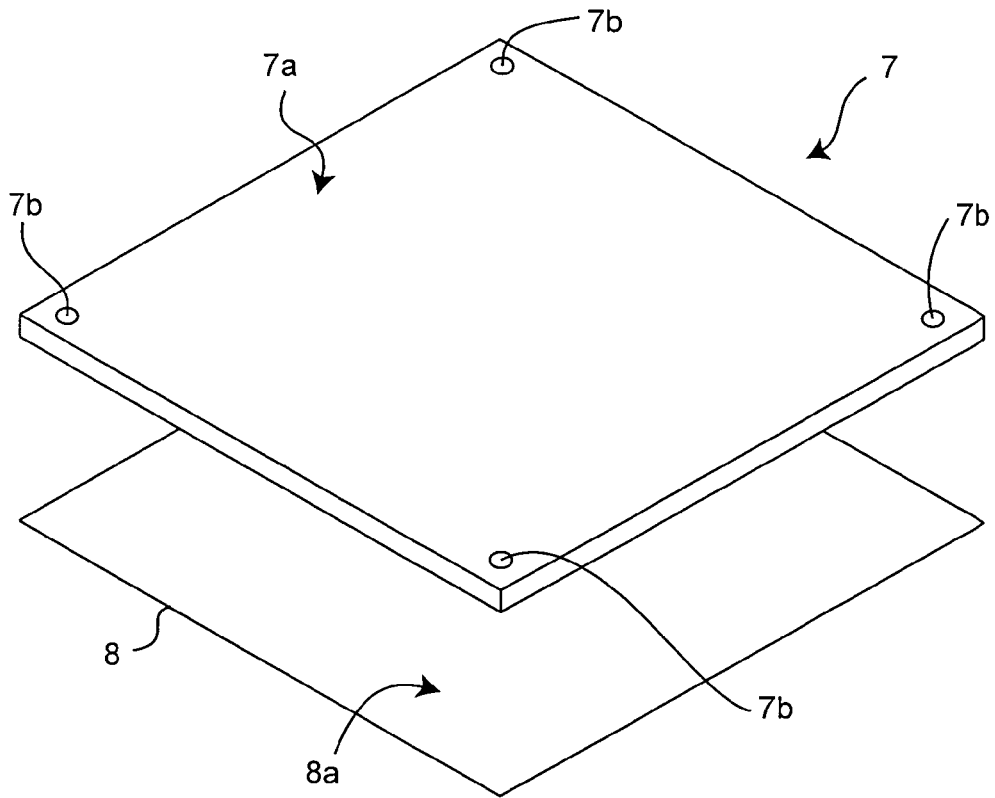
FIG. 7 is an outline perspective view showing an inspection-use jig board for use in the inspection of component mounting accuracy.

Description is now given of the inspection-use jig board 7 for use in the mounting accuracy inspection apparatus. As shown in FIG. 7, the jig board 7, which has a shape identical to the board 3 handled by the electric component mounting apparatus 101, is formed into a plate-like shape from light transmitting materials. Such light transmitting materials are exemplified by water-clear glass materials (such as quartz and soda lime). In FIG. 7, the top surface of the jig board 7 as viewed in the drawing is a component mounting-side surface 7a on which the jig component 5 is mounted as an electric component, and a reference mark 7b allowing reliable recognition of the placement position of the jig board 7 is disposed at respective corner areas of the almost square-shaped component mounting-side surface 7a. Further, for example, a diffuse reflection sheet 8 whose top surface side as viewed in the drawing is a diffuse reflecting surface 8a is applied onto the surface opposed to the component mounting-side surface 7a in the jig board 7 so as to form this opposed surface as a (diffuse) reflecting surface 8a. It is to be noted that for easy understanding of the configuration of the jig board 7, FIG. 7 shows the state that the diffuse reflection sheet 8 and the jig board 7 are separated, which is the state immediately before the diffuse reflection sheet 8 is applied onto the jig board 7. Thus, by forming the jig board 7 from the light transmitting material and further by providing the reflecting surface 8a on the surface opposed to the component mounting-side surface 7a, light applied from above the jig board 7 passes through the component mounting-side surface 7a and are reflected by the reflecting surface 8a so that the reflected light can pass through the component mounting-side surface 7a and travels upward. It is to be noted that as such a diffuse reflection sheet 8, for example, liquid crystal back light sheets having a quantity of reflected light and the like being controlled should preferably be used.

Herein in the present specification, the "diffusion" refers to the scattering state of light beams so that unlike steady application of light from a certain light source, a light beam touching a certain surface or a light beam passing an aperture are put into the state as if they come from every direction. Such diffusion can be achieved by, for example, reflection from a matte surface. However, when perfect diffusion is applied, a sharp image of the light source cannot be acquired, and the location where the diffusion is performed becomes an averagely wide-range light source which emits light evenly in every direction.

Figure 8:
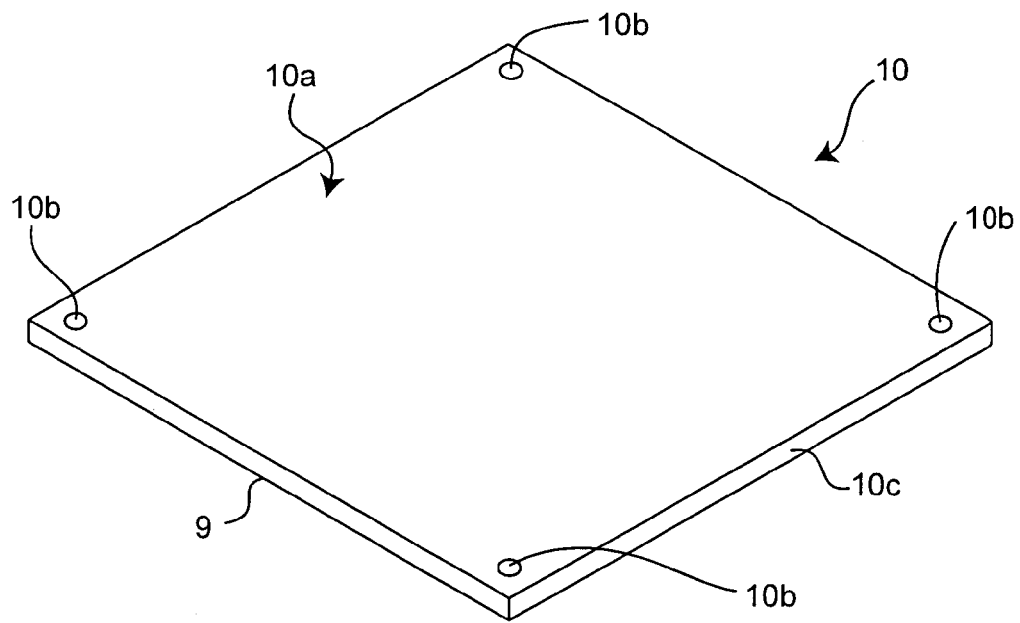
FIG. 8 is an outline perspective view showing an inspection-use jig board in another example for use in the inspection of component mounting accuracy.

Moreover, instead of forming the reflecting surface 8a on the jig board 7 by using such a diffuse reflection sheet 8, the surface opposed to a component mounting-side surface 10a (i.e., the back surface) of a jig board 10 may be processed to a mirror-smooth state as shown in FIG. 8 to form a reflecting surface 9. Such mirror finishing may be implemented by such processing methods as spattering, deposition, and plating. The reflecting surface 9 may also be formed by application of reflection sheets and mirror seals. It is to be noted that such a jig board 7 should preferably be formed to have a thickness of 1 mm or larger in consideration of the strength and suppression of warp generation. Also, the jig board 7 should preferably be formed to have a thickness of 4 mm or smaller in consideration of operability of the board (operability particularly in terms of weight). It is also preferable to use a diffuse reflection sheet 8 having a thickness of 30 to 50 μm.

Figure 9:
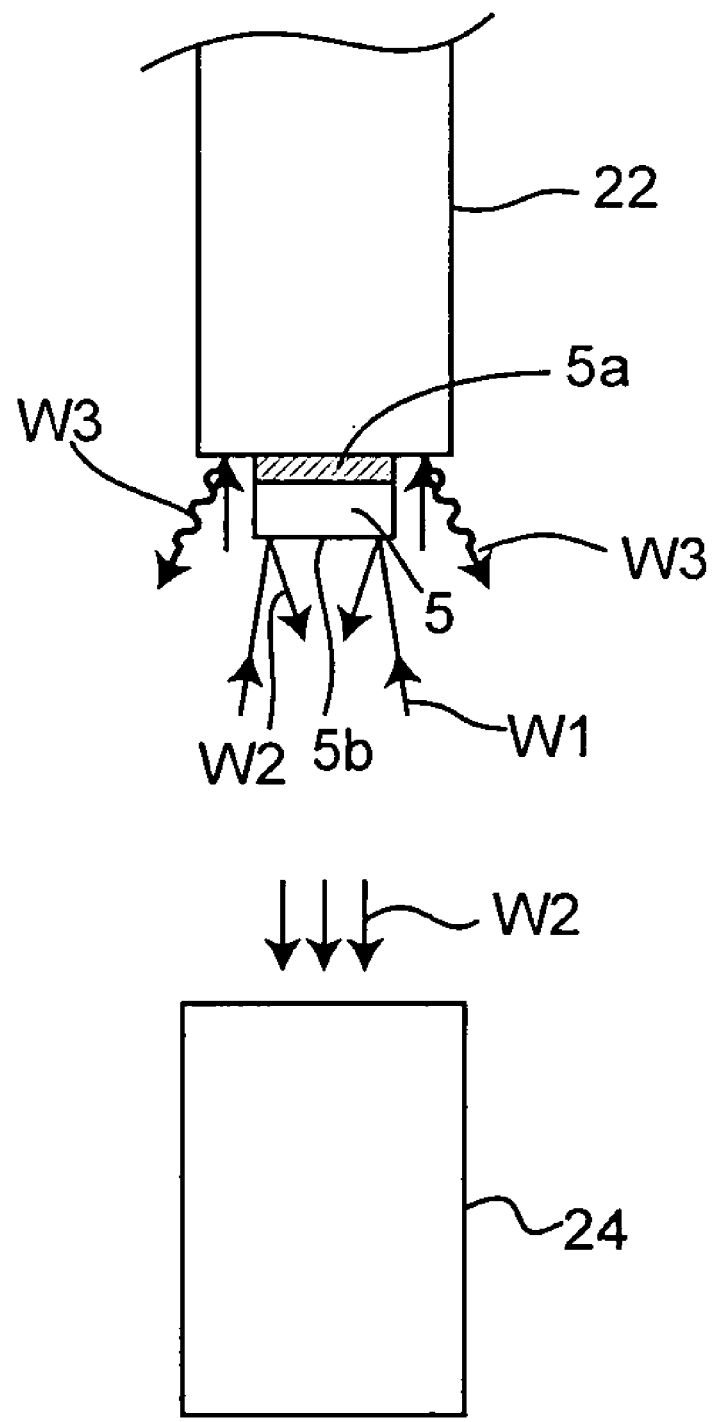
FIG. 9 is a schematic explanatory view showing the state of image pickup of the suction-and-holding posture of the jig component in inspection procedures of the component mounting accuracy.
Figure 10:
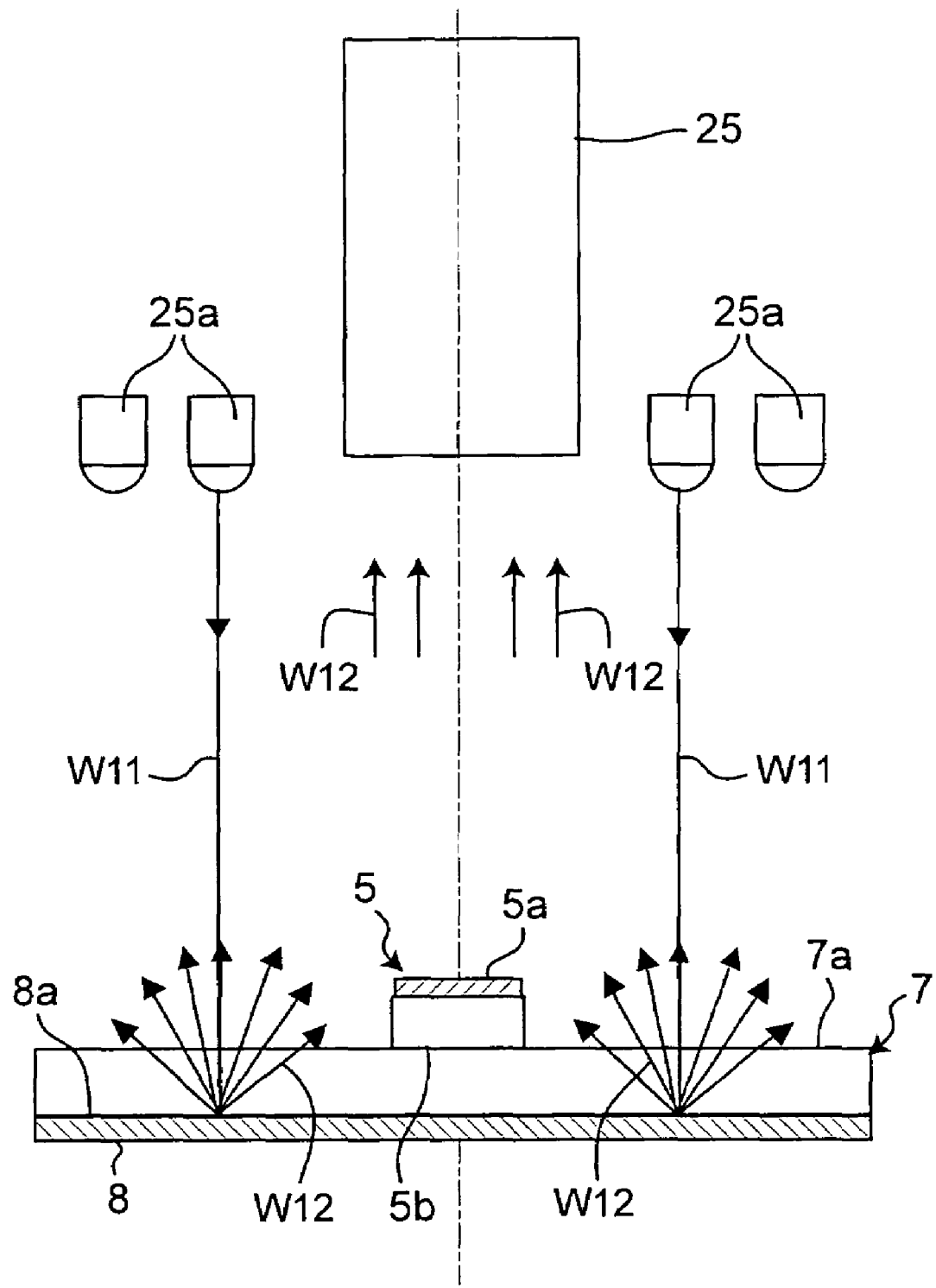
FIG. 10 is a schematic explanatory view showing the state of image pickup of the suction-and-holding posture of a jig component in inspection procedures of the component mounting accuracy in the case of using the jig board having a diffuse reflecting surface.
Figure 12:
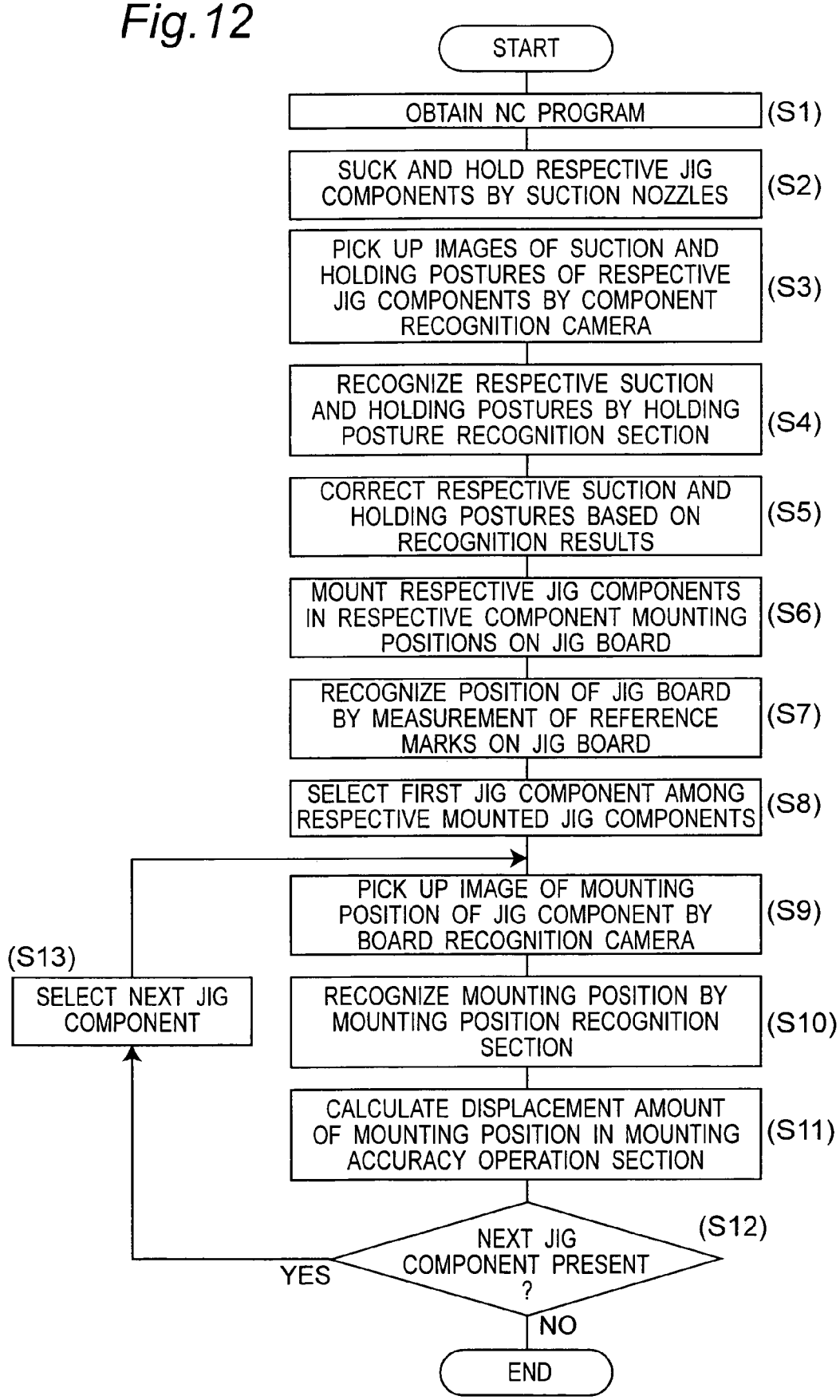
FIG. 12 is a flowchart showing inspection procedures of the component mounting accuracy.

Description is now given of the procedures for the component mounting accuracy detection device having such configuration to detect component mounting accuracy in the electric component mounting apparatus 101. FIG. 12 shows a flowchart showing the detection procedures of the component mounting accuracy. Further, FIG. 9 shows a schematic explanatory view showing the state that an image of the jig component 5 sucked and held by the suction nozzles 22 is picked up by the component recognition camera 24, and FIG. 10 shows a schematic explanatory view showing the state that an image of the mounting position of the jig component 5 mounted on the jig board 7 is picked up by the board recognition camera 25. It is to be understood that the operation control on the electric component mounting apparatus 101 in detection of the component mounting apparatus described hereinbelow, i.e., the operation control of the component mounting accuracy detection device, is comprehensively performed by the control device 50 while respective operations are associated with each other.

First, in step S1 in FIG. 12, in electric component mounting apparatus 101, NC data including information necessary for mounting a plurality of jig components 5 on a jig board 7 is inputted and stored in the control device 50. More specifically, for example in the control block diagram of the control device 50 shown in FIG. 4, the NC data is inputted through the input device 68, and the inputted NC data is inputted from the input device 68 into the RAM 69 or the ROM 70 by the interface controller 66 and the main controller 65 through the system bus 61, and is stored therein in an extractable way. It is to be noted that the NC data includes shape data on respective jig components 5 and the jig board 7, data on mounting order of the respective jig components 5, and mounting position data for mounting the respective jig components 5 on the jig board 7.

Moreover, while or after the NC data is obtained, in the electric component mounting apparatus 101 shown in FIG. 1, the jig board 7 is fed, and the fed jig board 7 is transported onto the XY table 13 by the transportation device 14 and held by the board holding table 13a. A plurality of jig components 5 are stored in the parts feeders 11a of the component feed unit 11 in an extractable way.

Then, one nozzle unit 21 in the main shaft device 12 is rotationally moved to the suction position A shown in FIG. 2, and a parts feeder 11a storing respective jig components 5 is aligned with a suction nozzle 22 selected among the respective suction nozzles 22 included in the one nozzle unit 21 as a first nozzle to perform suction and holding. After the alignment is achieved, the pertinent suction nozzle 22 is lowered and suction and holding of the jig component 5 by the suction nozzle 22 is performed (step S2). Then, the respective suction nozzles 22 in the one nozzle unit 21 are rotationally moved, and the next suction nozzle 22 is aligned with the parts feeder 11a and the next jig component 5 is sucked and held by the next suction nozzle 22. In the case of sucking and holding still another jig component 5, these procedures are performed repeatedly. It is to be noted that the jig component 5 may be sucked and held by a suction nozzle 22 included in another nozzle unit 21 by moving this another nozzle unit 21 to the upper side of the parts feeder 11a by rotational movement of the main shaft device 12.

Then, the rotational movement of the respective nozzle units 21 is performed in the main shaft device 12, and a nozzle unit 21 sucking and holding the jig component 5 is positioned in the component recognition position C. In the component recognition position C, the respective suction nozzles 22 included in the pertinent nozzle unit 21 are sequentially positioned above the component recognition camera 24, so that images of the suction-and-holding postures of the respective sucked and held jig components 5 are picked up (step S3).

As shown in FIG. 9, the jig component 5 is sucked and held from the top surface by the suction nozzle 22 with its irreflective surface 5a that is the black-colored surface as the top surface and its reflecting surface 5b as the bottom surface. The size of the jig component 5 is smaller than the size (width size or diameter size) of an end portion of the suction nozzle 22, and in the state of being sucked and held, the end portion of the jig component 5 does not protrude from the end section of the end portion of the suction nozzle 22. The alignment is made between the suction nozzle 22 in such a state and the component recognition camera 24 capable of picking up an image of an object disposed above, that is, the alignment is made in such a way that the center of an axis of the suction nozzle 22 is aligned with an optical axis of the image pickup operation of the component recognition camera 24. After the alignment is made, light W1 is applied in upward direction from the component recognition camera 24, and the light W1 is made to reflect downward by the reflecting surface 5b that is the bottom surface of the jig component 5 as viewed in the drawing, so that an image of the jig component 5 formed by the reflected light W2 is picked up by the component recognition camera 24. In this case, the light W1 applied to the end portion of the suction nozzle 22 is also reflected to be reflected light W3. However, a quantity of reflected light W3 is obviously lower than a quantity of the reflected light W2 obtained by the reflecting surface 5b of the jig component 5, and therefore a real image of the jig component 5 formed by the reflected light W2 can reliably be picked up by the component recognition camera 24. It is to be noted that after the image is picked up, images of other jig components 5 are picked up in sequence.

The real image data of the respective jig components 5 picked up by the component recognition camera 24 is inputted into the holding posture recognition section 63 by the image processing controller 62 in the control device 50 in FIG. 4, and recognition processing of the respective image data is performed in the holding posture recognition section 63 (step S4). Further in the holding posture recognition section 63, for example, reference holding posture data preset in the NC data and the like is collated with the holding posture data recognized in the recognition processing, by which respective posture correction amounts for matching the suction-and-holding postures of the jig components 5 by the respective suction nozzles 22 and the reference holding posture data are calculated, i.e., posture displacement amounts are calculated. Based on the data on the respective calculated posture correction amounts (so-called θ correction amounts), rotational correction is performed on the respective suction nozzles 22 included in the nozzle unit 21 positioned in the correction rotation position D (step S5).

Then, as shown in FIG. 2, the nozzle unit 21 is rotationally moved so as to be positioned in the mounting position E, and is disposed above the jig board 7 held by the board holding table 13a. Then, the jig component 5 sucked and held by one suction nozzle 22 (the suction nozzle 22 which first performs mounting operation) included in the nozzle unit 21 is aligned with the component mounting position for the jig component 5 to be mounted on the component mounting-side surface 7a of the jig board 7 by moving the jig component 5 in the X axis direction or the Y axis direction as viewed in the drawing by the X axis drive section 13b and the Y axis drive section 13c. After the alignment is made, the suction nozzle 22 is lowered and the sucked and held jig component 5 is mounted in the component mounting position on the jig board 7. It is to be noted that the mounting is achieved by, for example, interposing a bonding material having optical transparency such as double-faced tapes applied in advance on the component mounting-side surface 7a of the jig board 7. Then, respective jig components 5 sucked and held by other suction nozzles 22 are mounted on respective component mounting positions in the same procedures (step S6).

After the mounting operation of all the jig components 5 is completed, images of respective reference marks 7b put on the component mounting-side surface 7a of the jig board 7 are picked up by the board recognition camera 25, and based on the image data, the position of the jig board 7 is accurately recognized. Thus, recognizing the position of the jig board 7 after the mounting operation of all the jig components 5 is completed allows more accurate recognition of a real position of the jig board 7 including a displacement amount which is possibly generated along with the mounting operation of the respective jig components 5.

Then, the first jig component 5 is selected among the respective jig components 5 mounted on the jig board 7 (step S8), and the board recognition camera 25 for picking up an image of an object disposed below is aligned with the selected jig component 5 by XY movement of the jig board 7 by the XY table 13. It is to be noted that the alignment is made in such a way that an optical axis that is the center of image pickup of the board recognition camera 25 is aligned with the component mounting position of the jig component 5 that is an image pickup target.

The state of such alignment is shown in FIG. 10. As shown in FIG. 10, the jig board 7 is disposed with the component mounting-side surface 7a as the top surface as viewed in the drawing, and its back surface (i.e., the bottom surface as viewed in the drawing) is equipped with the reflecting surface 8a formed by application of the diffuse reflection sheet 8. The jig component 5 is mounted on the component mounting-side surface 7a of the jig board 7 with its irreflective surface 5a as the top surface as viewed in the drawing. Although a bonding material that is the double-faced tape having optical transparency is disposed in between the reflecting surface 5b that is the bottom surface of the jig component 5 and the component mounting-side surface 7a of the jig board 7 for securing the placement position of the jig component 5, the illustration thereof is omitted in FIG. 10. The board recognition camera 25 disposed above the jig board 7 has lighting units 25a disposed around the image pickup-side front surface (i.e., the bottom surface as viewed in the drawing) for applying image pickup light in downward direction as viewed in the drawing.

In the state shown in FIG. 10, light W11 is applied in downward direction as viewed in the drawing from the lighting units 25a included in the board recognition camera 25. The applied light W11 reaches the component mounting-side surface 7a and passes (transmits) through the component mounting-side surface 7a and the light transparency material inside the jig board 7, and further reaches the reflecting surface (or the diffuse reflecting surface) 8a formed from the diffuse reflection sheet 8. On the reflecting surface 8a, the light W11 is diffuse-reflected in various directions in almost upward direction as viewed in the drawing, by which reflected light (or diffused light) W12 is formed. The reflected light W12 transmits through the light transmitting material in such a way that light evenly spreads across almost the entire light transmitting material inside the jig board 7, and further the light transits through the component mounting-side surface 7a and travels toward the board recognition camera 25. More particularly, the light W11 is diffuse-reflected by the reflecting surface 8a of the diffuse reflection sheet 8 to be the reflected light 12, by which the entire inside of the jig board 7 functions as an almost uniform surface light source. In a region where the jig component 5 is disposed in the component mounting-side surface 7a, the jig component 5 formed from a material which does not transmit light blocks the reflected light W12, and therefore the reflected light W12 does not travel toward the board recognition camera 25. Further, the top surface of the jig component 5 mounted on the jig board 7 as viewed in the drawing is made to be the black-colored irreflective surface 5a, so that the light W11 applied by the lighting units 25a is not reflected by the top surface of the jig component 5. Therefore, the reflected light W12 is applied toward the board recognition camera 25 from a region of the component mounting-side surface 7a other than the region where the jig component 5 is disposed, and an image of an outline of the jig component 5 acquired by the applied reflected light W12, i.e., a silhouette image, is picked up by the component image pickup camera 25 (step S9). Since the reflected light W12 is almost evenly diffused in the jig board 7, the reflected light W12 can be spread across the component mounting-side surface 7a of the jig board 7 which is equivalent to the region where the jig component 5 is disposed. Therefore, in the vicinity of the boundary between the inside and the outside of the outer periphery of the jig component 5 in the component mounting-side surface 7a, transmission and blockage of the reflected light W12 can definitely be distinguished, which makes it possible to provide a clear silhouette image of the jig component 5.

The picked up silhouette image data of the jig component 5 is inputted into the mounting position recognition section 64 by the image processing controller 62 in the sequence controller 59 shown in FIG. 4, and in the mounting position recognition section 64, recognition processing of the silhouette image is performed, so that, for example, an outline of the jig component 5 is calculated from the silhouette image and the center of the outline is calculated as a real component mounting position (step 10).

The data on the calculated real component mounting position is inputted into the mounting accuracy operation section 73 by the image processing controller 62, and in the mounting accuracy operation section 73, for example, preset component mounting position data included in the NC data is collated with the real component mounting position data so as to calculate a difference between both the data, i.e., a displacement amount (step S11). The calculated displacement amount becomes component mounting accuracy in the electric component mounting apparatus 101. It is to be noted that the calculated component mounting accuracy data is stored in the RAM 69 in the control device 50 or outputted to the outside of the control device 50 by the interface controller 66.

Then, in step S12, it is determined whether or not a next mounted jig component 5 to be subjected to an image pickup operation is present, and if it is present, then the jig component 5 is selected. After the selection, the above-stated respective procedures from steps S9 to S11 are performed in sequence so as to acquire an image of the silhouette of the selected jig component 5 for calculating the component mounting accuracy. If it is determined in step S12 that the next mounted jig component 5 to be selected is not present, then the procedures of the mounting accuracy inspection are ended.

Figure 11:
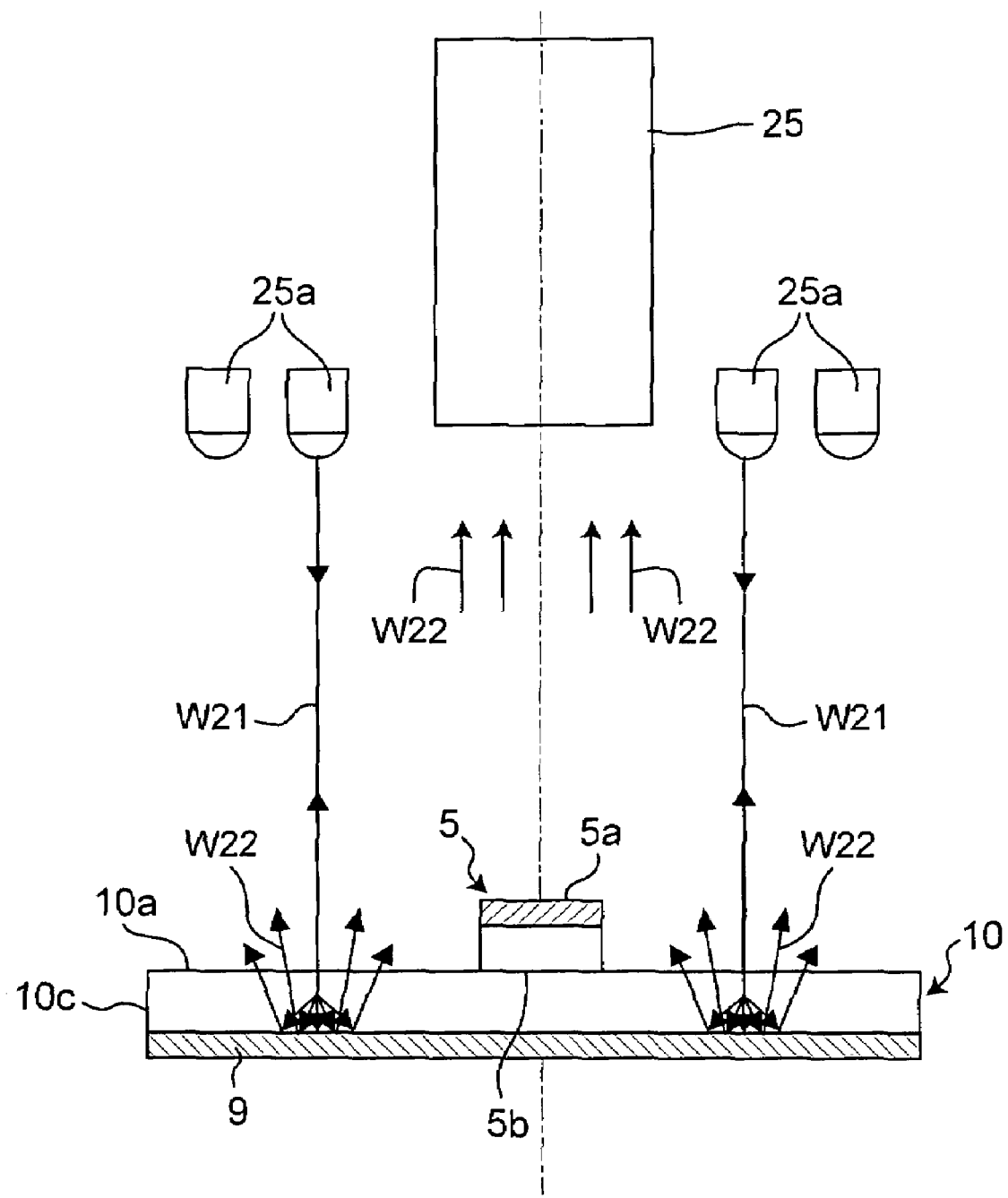
FIG. 11 is a schematic explanatory view showing the state of image pickup of the mounting position of the jig component in inspection procedures of the component mounting accuracy in the case of using the jig board having a diffuse reflecting surface.

Although in the procedures of the component mounting accuracy inspection, description has been given of the case of using the jig board 7 having the diffuse reflecting surface 8a obtained by application of the diffuse reflection sheet 8 shown in FIG. 7, the present invention is not limited to the case of using such a jig board. The jig board 10 having a specular reflecting surface 9 as shown in FIG. 8 may be used instead. FIG. 11 shows a schematic explanatory view showing the state in which an image of such a jig board 10 is acquired by the board recognition camera 25.

As shown in FIG. 11, the specular reflecting surface 9 is formed on the lower-side surface of the jig board 10 as viewed in the drawing, and further in the inside of the jig board 10, a diffusion layer 10c exemplifying the light transmitting material which diffuses the light reflected by the specular reflecting surface. Herein, the "diffusion layer" refers to the layer which diffuses incident light when the light transmits through the layer. In the present embodiment, as the diffusion layer 10c, opalescent glass materials may be used for example, and the thickness thereof should preferably be in the range of 1 mm to 4 mm, which is almost identical to the thickness of the jig board 10 itself. In the jig board 10 with such a configuration, light W21 applied from the lighting units 25a to the jig board 10 transmits through the component mounting-side surface 10a of the jig board 10 and transmits through the diffusion layer 10c as shown in FIG. 11. When transmitting through the diffusion layer 10c, the light W21 is diffused in various directions. Among the diffused light W21, light with an almost downward traveling direction as viewed in the drawing reaches the specular reflecting surface 9, is reflected in almost upward direction as viewed in the drawing by the specular reflecting surface 9, and again transmits through the diffusion layer 10c as reflected light (or diffused light) W22. The reflected light W22 is again diffused when passing through the diffusion layer 10c and travels toward the board recognition camera 25 from the component mounting-side surface 10a. The light W21 applied to the irreflective surface 5a of the jig component 5 is not reflected, and further, in the region where the jig component 5 is disposed in the component mounting-side surface 10a, the reflected light W22 is blocked so that it will not travel upward from the component mounting-side surface 10a. Therefore, as with the case of using the diffuse reflection sheet 8 shown in FIG. 10, the reflected light W22 may go out from the component mounting-side surface 10a, thereby allowing an image of the silhouette of the jig component 5 to be picked up by the board recognition camera 25. Moreover, with such use of the diffusion layer 10c, an optical path for diffusion (i.e., thickness of the diffusion layer) becomes larger, and although a quantity of light in a specified direction is reduced by diffusion, the optical path necessary for diffusion can be increased, which allows light to be diffused more than the case with use of the diffuse reflecting surface 8a, resulting in an advantage that more uniform surface light source can be formed.

Figure 20:
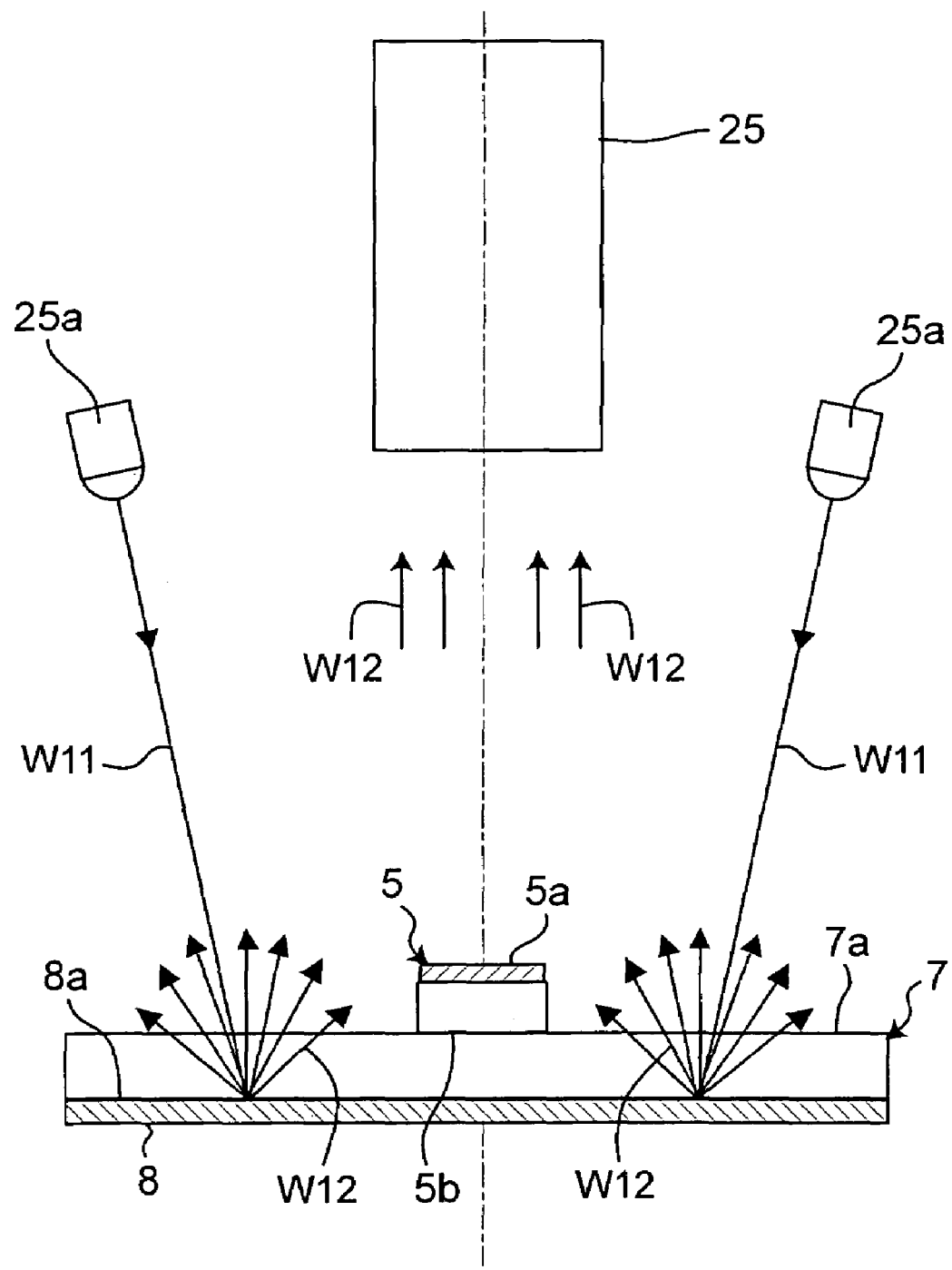
FIG. 20 is a schematic explanatory view explaining a method for inspecting component mounting accuracy in a modified example of the present embodiment.

Moreover, such a light diffusion function is given to the jig boards 7 and 10, so that not only in the case where light is applied onto the jig boards 7, 10 or the jig component 5 in the vertical direction, but also in the case where, for example as shown in a schematic explanatory view in FIG. 20, light is applied in directions inclined from the vertical direction, performing light diffusion with use of the diffusion function allows an image of a silhouette of the jig component 5 to be acquired. For example, in the case where light is applied in a direction slightly inclined from the vertical direction, the contrast of the silhouette of the jig component 5 can be made more clear, which allows acquisition of clearer images. Particularly, it is often difficult in reality to apply light in the vertical direction due to the arrangement relationship between the board recognition camera 25 and the lighting units 25a. However, even in such a case, it becomes possible to reliably accomplish acquisition of the clear image of the jig component 5. It is to be noted that the sufficiently adoptable angle of inclination against the vertical direction is, for example, in the range of about 45 degrees.

Moreover, adjusting the amount of light diffusion in the diffuse reflecting surface 8a and the diffusion layer 10c allows adjustment of lightness of the obtained silhouette image and distinction of the outline. By using, for example, the diffuse reflection sheet 8 in which a light diffusion amount in the reflecting surface 8a is regulated to take a specified value, such adjustment can be made feasible. Moreover, setting the thickness of the diffusion layer 10c in such a way as to have an optical path necessary for desired diffusion makes the adjustment to be implemented.

Figure 13:
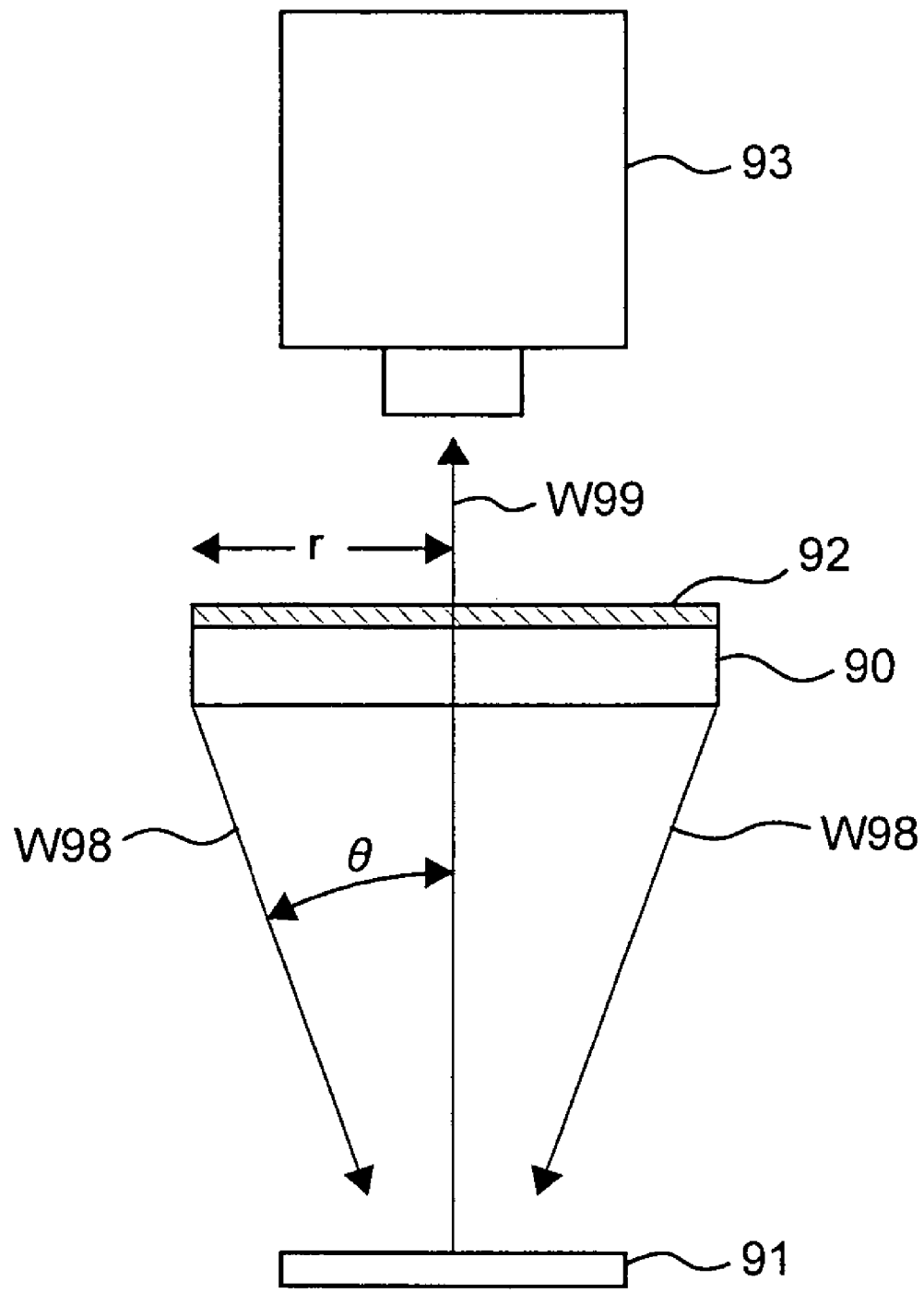
FIG. 13 is a schematic explanatory view showing a method for measuring radiance.

For example, such a light diffusion amount should preferably be 4.5 or more in relative reflectance on the diffuse reflecting surface. Herein, the relative reflectance refers to a radiance ratio of a measurement sample to a white standard sample, which is measured by a measurement method such as shown in FIG. 13. More specifically, as shown in FIG. 13, light W98 inclined by a specified angle $\theta$ from the vertical direction is applied onto a measurement sample 91 disposed beneath a ring light 90 as viewed in the drawing, so that reflected light W99 reflected upward on the measurement sample 91 passes through a polarizing plate 92, and then comes incident into a spectral radiance meter 93, thereby allowing radiance of the measurement sample 91 to be measured. It is to be noted that the measurement sample 91 herein refers to, for example, the jig board 7 having the diffuse reflecting surface 8a with the diffuse reflecting surface 8a disposed on the bottom surface side as viewed in the drawing and the component mounting-side surface 7a disposed on the top surface side as viewed in the drawing. Moreover, in the measurement device in FIG. 13, for example, a radius r of the polarizing plate 92 is 28.75 mm and the specified inclined angle $\theta$ is 10°.

Moreover, if such a light diffusion amount is expressed as a contrast between an image of the jig component 5 and a background image in the silhouette image of the jig component 5, the contrast should have, for example, a difference of 70 or more shades of gray (in the case of 256 shades of gray). More particularly, in order to secure good component position recognition accuracy, the contrast between the jig component 5 and its background should preferably be 70 or more shades of gray.

Moreover, although in the description of the inspection procedures for the component mounting apparatus, description has been given of the case in which a plurality of jig components 5 are mounted on the jig board 7 to inspect the component mounting accuracy of the respective jig components 5, the present invention is not limited to this case. Instead of this case, for example, an average value of displacement amounts calculated for the respective jig components 5 may be calculated as the component mounting accuracy in the electric component mounting apparatus 101.

Moreover, instead of the case where a plurality of the jig components 5 are of the same kind, the case of using the jig components 5 different in kind from each other is also supported. In such a case, the component mounting accuracy of the jig components 5 can be calculated by kinds, allowing broad-ranging inspection of the component mounting accuracy in the electric component mounting apparatus 101.

Moreover, although in the inspection method for the component mounting accuracy, description has been given of the case in which respective jig components 5 are mounted on the jig board 7, the present inspection method is not limited to this case. Instead of this case, it is possible to support the case in which real electric components 1 are mounted on the jig board 7, light is applied onto the component mounting-side surface 7a of the jig board 7 by the board recognition camera 25 so that images of silhouettes of the real electric components 1 formed by the reflected light are picked up, and recognition processing of the picked up image data is performed to calculate component mounting accuracy. Such a technique has an advantage in that inspection can be performed more easily as it is not necessary to prepare perspective jig components 5.

Moreover, the case in which the jig component 5 is mounted on a real board 3 with the reflecting surface 5b of the jig component 5 being the top surface and the irreflective surface 5a being the bottom surface may also be supported. Such mounting arrangement makes it possible to reflect the light applied onto the component mounting-side surface of the board 3 by the reflecting surface 5b that is the top surface of the jig component 5, acquire a real image of the jig component 5 formed by the reflected light, and to perform recognition processing of the acquired real image data so as to detect the component mounting position. Such a technique has an advantage in that inspection can be performed more easily as it is not necessary to prepare the jig board 7. It is to be noted that in such a case, the component mounting-side surface of the real board 3 should preferably be in black color so as to have a reduced reflecting efficiency. This allows acquisition of clearer images.

Instead of this case, it is also possible to support the case in which the jig component 5 is mounted, with its irreflective surface 5a as the top surface, on the component mounting-side surface of a real board 3 which is colored with those colors enhancing reflecting efficiency such as white and. Such an arrangement makes it possible to acquire an image of the silhouette of the jig component 5 formed by the reflected light on the surface of the board 3.

Working Example and Comparative Example

Description is now given of a difference in recognition result between the working examples of the inspection method for component mounting accuracy in the present embodiment and the conventional inspection methods as comparative examples to the working examples.

First, in the comparative example, that is a conventional technique, a so-called 1608C component is used without modification as an electric component 505, an image of the electric component 505 sucked and held by a suction nozzle is acquired by a reflection method (method to acquire an image formed by reflection of the light applied onto the surface of the electric component 505), then the electric component 505 is mounted on a board (e.g., black-colored board), an image of the mounted electric component 505 is acquired by the reflection method, and recognition processing of the acquired image is performed to calculate a displacement amount of its mounting position.

In the present working example, with use a jig component 5, an image of the reflecting surface 5b of the jig component 5 sucked and held from the irreflective surface 5a by the suction nozzle is acquired by the reflection method, then the jig component 5 is mounted so that the reflecting surface 5b of the jig component 5 is in contact with the component mounting-side surface 7a of the jig board 7, light is applied from the upper side onto the mounted jig component 5 so as to acquire an image of the silhouette of the jig component 5 formed by diffused light reflected by the diffuse reflecting surface 8a of the jig board 7, and recognition processing of the resultant image is performed to calculate a displacement amount of its mounting position.

Figure 14:
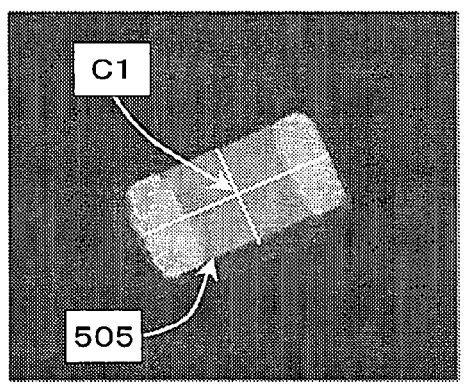
FIG. 14 is a view showing an image of an electric component in a sucked and held state in a comparative example.
Figure 15:
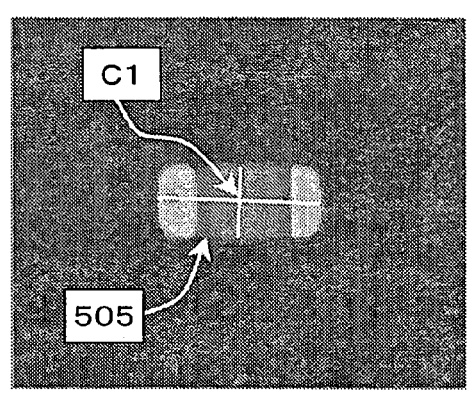
FIG. 15 is a view showing an image of an electric component in a state of being mounted on a board in the comparative example.
Figure 16:
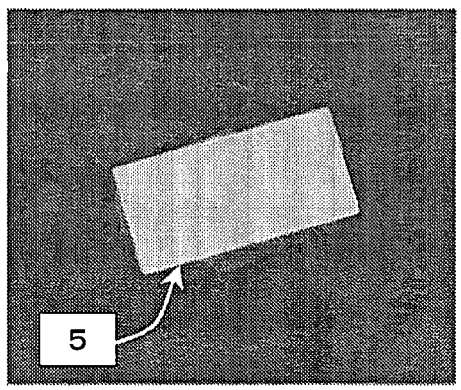
FIG. 16 is a view showing an image of the jig component in a sucked and held state in a working example of the embodiment.
Figure 17:
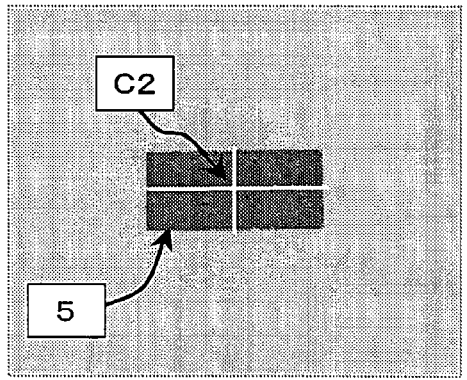
FIG. 17 is a view showing an image of the jig component mounted on the jig board in the working example.

As thus-acquired respective images, an image of the suction-and-holding posture of the electric component 505 by the suction nozzle in the comparative example is shown in FIG. 14, an image of the electric component 505 mounted on the board in the comparative example is shown in FIG. 15, an image of the suction-and-holding posture of the jig component 5 by the suction nozzle in the working example is shown in FIG. 16, and further an image of the jig component 5 mounted on the jig board 7 in the working example is shown in FIG. 17.

In comparison between FIG. 14 and FIG. 16 which are images of the suction-and-holding posture by the suction nozzle, an outline of the electric component 505 is not clear, and particularly in edge portions, the edges are not seen clearly in the image in the comparative example shown in FIG. 14, whereas in the image in the working example shown in FIG. 16, the outline of the jig component 5 including the edge portions are seen clearly. In comparison between FIG. 15 and FIG. 17 which are images of the components in the state of being mounted on the board or the jig board 7, the outline is seen unclear like the image of the suction-and-holding posture in the image in the working example shown in FIG. 15, whereas in the image in the working example shown in FIG. 17, the outline is seen clearly.

In the case that recognition processing is performed by using the image of the unclear outline of the electric component 505 as shown in the comparative example to calculate a center position C1 of the electric component 505, an error caused by the calculation tends to increase. Performing recognition processing with use of the image with the clear outline of the jig component 5 as shown in the working example allows reliable calculation of the center position C2 of the jig component 5, and makes an error amount caused by the calculation smaller than that of the comparative example.

Herein, repeat accuracy of the component mounting position detection detected based on the images of the mounted state in the comparative example and the working example is shown in Table 1 as a maximum value, a minimum value, an average value and 3σ in X-axis direction, Y-axis direction and θ direction. Further, difference between the mounting position accuracy detected based on the images and the result of the mounting position accuracy of the electric component or the jig component in the state of being mounted measured by a primary standard for measurement of mounting accuracy are shown in Table 2 as a maximum value, a minimum value, a difference between the maximum value and the minimum value, an average value and 3σ in each direction.

TABLE 1

| | Comparative Example Electric Component (1608C Component) | | | Working Example Jig Component | | |
|---|---|---|---|---|---|---|
| | X Direction [um] | Y Direction [um] | θ Direction [deg] | X Direction [um] | Y Direction [um] | θ Direction [deg] |
| Max. Value | 14.00 | 35.00 | 1.75 | 9.00 | 8.00 | 0.87 |
| Min. Value | 3.00 | 1.00 | 0.19 | 1.00 | 0.00 | 0.00 |
| Ave. Value | 7.89 | 7.03 | 0.78 | 3.91 | 3.76 | 0.29 |
| 3σ | 6.81 | 16.38 | 1.03 | 4.74 | 5.01 | 0.58 |

TABLE 2

| | Comparative Example Electric Component (1608C Component) | | | Working Example Jig Component | | |
|---|---|---|---|---|---|---|
| | X Direction [um] | Y Direction [um] | θ Direction [deg] | X Direction [um] | Y Direction [um] | θ Direction [deg] |
| Max. Value | 52.90 | 49.00 | 1.45 | 16.70 | 10.60 | 0.60 |
| Min. Value | −47.70 | −86.60 | −2.25 | 2.00 | −5.70 | −0.34 |
| Max.-Min. Value | 100.60 | 135.60 | 3.70 | 14.70 | 16.30 | 0.94 |
| Average value | 4.76 | −19.54 | −0.12 | 9.14 | 2.76 | 0.11 |
| 3σ | 46.20 | 68.10 | 1.81 | 9.34 | 9.32 | 0.57 |

As shown in Table 1 and Table 2, it is clear that the repeat accuracy of the component mounting position detection is increased in the working example than the comparative example, and it is also clear that the accuracy of the working example is considerably increased from the primary standard for measurement of mounting accuracy. For example, the component mounting position detection accuracy can be increased from about 20 μm/3σ in the conventional example to 10 μm/3σ in the working example.

According to the embodiment, the various effects as shown below may be fulfilled.

First, the jig board 7 is formed from a light transmitting material, and further a reflecting surface 8a facing the component mounting-side surface 7a is formed on the surface opposed to the component mounting-side surface 7a, so that light is applied onto the component mounting-side surface 7a with the jig component 5 mounted thereon, the light is made to transmit through the component mounting-side surface 7a and the light transmitting material and reflected on the reflecting surface 8a, the reflected light is made to go upward from the component mounting-side surface through the light transmitting material, by which an image of the silhouette of the jig component 5 formed by the reflected light can be acquired.

In such a detection method in the conventional example, the component mounting-side surface of a board with a jig component mounted thereon is used as a reflecting surface and an image of the silhouette of the jig component formed by the reflected light is acquired. Since such a jig component is usually mounted on the component mounting-side surface through a light transmitting double-faced tape and the like, disposing the double-faced tape on the reflecting surface causes the reflected light to be distorted around the jig component, and the distortion appears as noise in the vicinity of the outline of the silhouette image. In such a case, the outline cannot be recognized accurately, which disturbs detection of accurate component mounting accuracy.

In the inspection method in the present embodiment, since the reflecting surface 8a is formed on the surface opposed to the component mounting-side surface 7a, the light applied onto the component mounting-side surface 7a transmits through the doubled-face tape, the component mounting-side surface 7a and through the jig board 7, and can be reflected without causing disturbance in the reflecting surface 8a. Therefore, it becomes possible to suppress occurrence of the problem, thereby allowing high-accuracy detection of the component mounting accuracy.

Further, since the reflecting surface 8a has the light diffusion function, the reflected light can be diffused almost evenly in the jig board 7, and therefore the entire background of the jig component 5 can be brightened and function as the surface light source, which allows acquisition of images with clearer silhouette.

Figure 18:
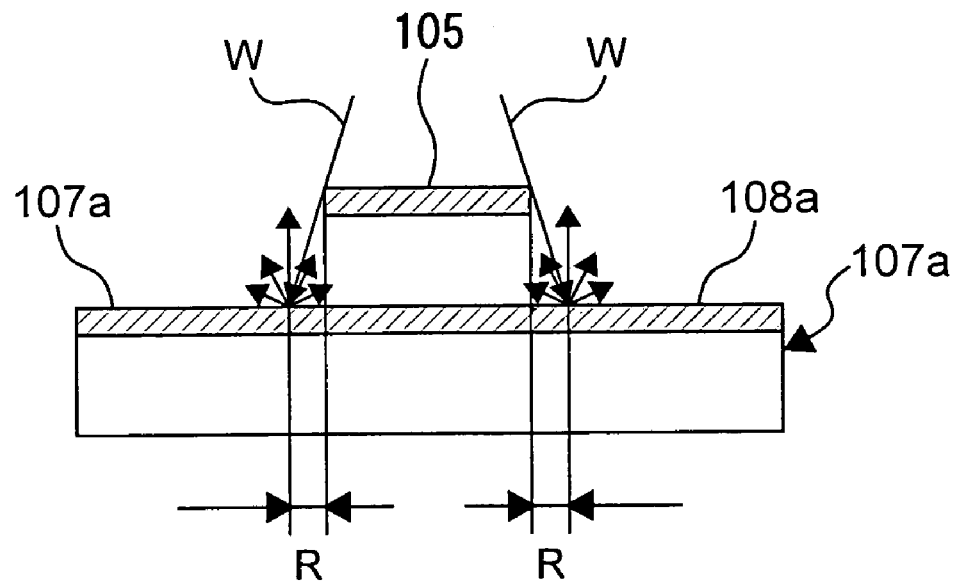
FIG. 18 is a schematic explanatory view showing the state that the diffuse reflecting surface of the board is disposed on the component mounting-side surface.
Figure 19:
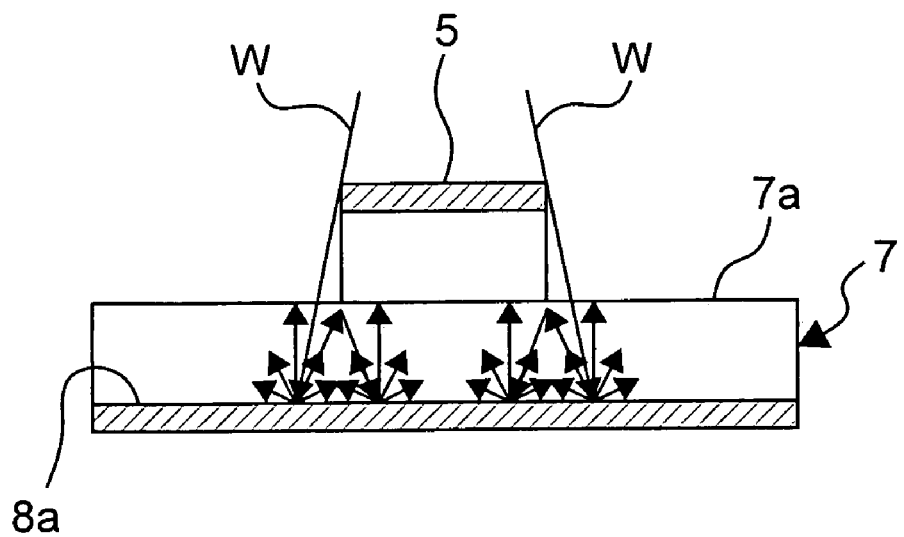
FIG. 19 is a schematic explanatory view showing a configuration of the diffuse reflecting surface in the jig board in the present embodiment.

Particularly, as shown in a schematic explanatory view in FIG. 18, in the case where a diffuse reflecting surface 108a for diffuse-reflecting applied light W is provided on a component mounting-side surface 107a that is a top surface of a board 107 as viewed in the drawing, even if the light W is diffuse-reflected, there still is a portion in the vicinity of a component 105 where the light do not reach, which produces a portion R where shadow is generated in a picked up image. By placing the diffuse reflecting surface 8a not on the component mounting-side surface 7a of the jig board 7 but on the bottom surface side as shown in the schematic explanatory view in FIG. 19, the diffused light W can be spread to the inside of the jig board 7 even on the back-side portion where the jig component 5 is disposed as viewed in the drawing. By spreading the light in this way, a portion where shadow is generated in the vicinity of the jig component 5 can be decreased and an image of the outline of the jig component 5 can be clarified.

Moreover, as the jig component 5 is formed such that its top face is the irreflective surface 5a and its bottom surface is the reflecting surface 5b, sucking and holding the jig component 5 from its top surface with the suction nozzle 22 allows the reflecting surface 5b to be placed on the lower side. By performing suction and holding in such layout, light is applied from the lower side of the suction nozzle 22 by the component recognition camera 24, a real image of the jig component 5 formed by the light reflected by the reflecting surface 5b of the jig component 5 is picked up, and recognition processing of the picked up image is performed so as to make it possible to reliably recognize the suction-and-holding posture. Particularly, in the case of recognizing the suction-and-holding posture of the jig component 5 which is downsized to the level smaller than the end portion of the suction nozzle 22, it is difficult to pick up an image of the silhouette of the jig component 5 formed by the applied light, and therefore the above image pickup method becomes more effective.

Further, the jig component 5 is mounted on the jig board 7 with its reflecting surface 5b side placed on the component mounting-side surface 7a, so that the light applied toward the component mounting-side surface 7a goes to the irreflective surface 5a of the jig component 5, making it possible to suppress the light from being reflected by the jig component 5. This makes it possible to acquire a clearer image of the silhouette formed by the reflected light, thereby allowing high-accuracy recognition of mounting position, i.e., inspection of component mounting accuracy.

Moreover, the jig component 5 which is formed with one face as the irreflective surface 5a and the other face as the reflecting surface 5b can be mounted not only on the jig board 7 but also on a real board 3. In the case of mounting it on the real board 3, the jig component 5 is mounted with the reflecting surface 5b facing up so that a real image of the jig component 5 formed by reflection of the light applied onto the reflecting surface 5b of the jig component 5 can be picked up. This allows implementation of diversified various inspection methods.

Moreover, since the jig board 7 is formed from a light transmitting material such as glass materials, its deflection amount can be reduced, allowing inspection to be implemented at higher accuracy.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-072174 filed on Mar. 15, 2004 including specification, drawing and claims are incorporated herein by reference in its entirety.

The invention claimed is:

1. A method for inspecting component mounting accuracy in a component mounting operation mounting a component held by a component holding member on a board, comprising:

with use of an inspection-use component having an almost rectangular parallelepiped shape and having an irreflective surface as one surface and a reflecting surface as a surface opposed to the one surface, while applying light to the reflecting surface of the inspection-use component in a state in which the irreflective surface is held by the component holding member, picking up a real image of the inspection-use component formed by reflected light created by the applied light;

recognizing a posture of the inspection-use component held by the component holding member by recognizing image data of the picked up real image;

mounting the inspection-use component with the component holding member in such a way that the reflecting surface of the inspection-use component is disposed in a component mounting position on a component mounting side-surface of an inspection-use board which is formed from a light transmitting material and which has a reflecting surface disposed on a surface opposed to the component mounting side-surface and facing the component mounting side-surface, while correcting posture-displacement between the recognized holding posture and a reference holding posture;

while applying light to the component mounting-side surface of the inspection-use board so as to transmit the applied light through the component mounting-side surface and reflect the applied light on the reflecting surface, picking up an image of an outline of the inspection-use component formed by reflected light coming from around the inspection-use component through the component mounting-side surface; and calculating an actual mounting position of the inspection-use component by recognizing image data of the picked up outline, and then obtaining a component mounting accuracy by calculating a difference between the actual mounting position and a preset component mounting position.

2. The method for inspecting the component mounting accuracy as defined in claim 1, wherein the light transmitting material is a glass material.

3. The method for inspecting the component mounting accuracy as defined in claim 1, wherein the reflecting surface of the inspection-use board is a specular reflecting surface for specular reflection of the applied light, and the inspection-use board has a diffusion layer disposed in between the component mounting-side surface and the specular reflecting surface, for diffusing the specular-reflected light.

4. The method for inspecting the component mounting accuracy as defined in claim 1, wherein the reflecting surface of the inspection-use board is a diffuse reflecting surface for reflecting the applied light with diffusion.

5. The method for inspecting the component mounting accuracy as defined in claim 4, wherein the diffuse reflecting surface is formed by applying a diffuse reflection sheet onto an opposite surface of the inspection-use board.

6. A method for inspecting component mounting accuracy in a component mounting operation mounting a component held by a component holding member on a board, comprising:

mounting the component with the component holding member in a component mounting position on a component mounting side-surface of an inspection-use board, which is formed from a light transmitting material and which has a reflecting surface disposed on a surface opposed to the component mounting side-surface and facing the component mounting side-surface;

while applying light to the component mounting-side surface of the inspection-use board so as to transmit the applied light through the component mounting-side surface and reflect the applied light on the reflecting surface, picking up an image of an outline of the component formed by reflected light coming from around the component through the component mounting-side surface; and calculating an actual mounting position of the component by recognizing image data of the outline acquired by the image pickup operation and then obtaining a component mounting accuracy by calculating a difference between the actual mounting position and the preset component mounting position.

7. An apparatus for inspecting component mounting accuracy in a component mounting apparatus for mounting a component held by a component holding member on a board, comprising:

an inspection-use board which is held by the component mounting apparatus in place of the board, is formed from a light transmitting material, and has a reflecting surface disposed on a surface opposed to a component mounting-side surface of the inspection-use board and facing the component mounting-side surface;

an inspection-use component which is fed to the component mounting apparatus in place of the component, forms an almost rectangular parallelepiped shape having an irreflective surface as one surface and a reflecting surface as a surface opposed to the one surface, and is held by the component holding member with its held surface as the irreflective surface and mounted on the inspection-use board in such a way that the reflecting surface faces the component mounting-side surface of the inspection-use board;

a component image pickup device for applying light to the reflecting surface of the inspection-use component in a state in which the irreflective surface is held by the component holding member and for picking up an image of the inspection-use component formed by a reflected light created by the applied light;

a board image pickup device for applying light to a component mounting-side surface of the inspection-use board with the inspection-use component mounted in a component mounting position so as to transmit the applied light through the component mounting-side surface and reflect the light on the reflecting surface and for picking up an image of an outline of the inspection-use component formed by a reflected light coming from around the inspection-use component through the component mounting-side surface;

a holding posture recognition section for recognizing a posture of the inspection-use component held by the component holding member by recognizing an image data of a real image of the inspection-use component while being held so as to correct posture-displacement between the recognized holding posture and a reference holding posture;

a mounting position recognition section for recognizing an actual mounting position of the inspection-use component by recognizing an image data of the outline of the inspection-use component while being mounted; and a mounting accuracy operation section for obtaining the component mounting accuracy by calculating a difference between the actual mounting position recognized by the mounting position recognition section and a preset mounting position of the inspection-use component;

wherein the reflecting surface of the inspection-use board is a specular reflecting surface for specular reflection of the applied light, and the inspection-use board has a diffusion layer for diffusing the specular-reflected light.

8. An apparatus for inspecting component mounting accuracy in a component mounting apparatus for mounting a component held by a component holding member on a board, comprising:

an inspection-use board which is held by the component mounting apparatus in place of the board, is formed from a light transmitting material, and has a reflecting surface disposed on a surface opposed to a component mounting-side surface of the inspection-use board and facing the component mounting-side surface;

an inspection-use component which is fed to the component mounting apparatus in place of the component, forms an almost rectangular parallelepiped shape having an irreflective surface as one surface and a reflecting surface as a surface opposed to the one surface, and is held by the component holding member with its held surface as the irreflective surface and mounted on the inspection-use board in such a way that the reflecting surface faces the component mounting-side surface of the inspection-use board;

a component image pickup device for applying light to the reflecting surface of the inspection-use component in a state in which the irreflective surface is held by the component holding member and for picking up an image of the inspection-use component formed by a reflected light created by the applied light;

a board image pickup device for applying light to a component mounting-side surface of the inspection-use board with the inspection-use component mounted in a component mounting position so as to transmit the applied light through the component mounting-side surface and reflect the light on the reflecting surface and for picking up an image of an outline of the inspection-use component formed by a reflected light coming from around the inspection-use component through the component mounting-side surface;

a holding posture recognition section for recognizing a posture of the inspection-use component held by the component holding member by recognizing an image data of a real image of the inspection-use component while being held so as to correct posture-displacement between the recognized holding posture and a reference holding posture;

a mounting position recognition section for recognizing an actual mounting position of the inspection-use component by recognizing an image data of the outline of the inspection-use component while being mounted; and a mounting accuracy operation section for obtaining the component mounting accuracy by calculating a difference between the actual mounting position recognized by the mounting position recognition section and a preset mounting position of the inspection-use component;

wherein the reflecting surface of the inspection-use board is a diffuse reflecting surface for reflecting the applied light with diffusion.

* * * * *